United States Patent
Zhang et al.

(10) Patent No.: US 12,413,001 B2
(45) Date of Patent: Sep. 9, 2025

(54) HETEROGENOUS SOCKET CONTACT FOR ELECTRICAL AND MECHANICAL PERFORMANCE SCALING IN A MICROELECTRONIC PACKAGE

(71) Applicant: Intel Corporation, Santa Clara, CA (US)

(72) Inventors: Zhichao Zhang, Chandler, AZ (US); Zhe Chen, Chandler, AZ (US); Steven A. Klein, Chandler, AZ (US); Feifei Cheng, Chandler, AZ (US); Srikant Nekkanty, Chandler, AZ (US); Kemal Aygun, Tempe, AZ (US); Michael E. Ryan, Fountain Hills, AZ (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 910 days.

(21) Appl. No.: 17/352,103

(22) Filed: Jun. 18, 2021

(65) Prior Publication Data
US 2022/0407254 A1 Dec. 22, 2022

(51) Int. Cl.
*H01R 43/16* (2006.01)
*H01R 12/72* (2011.01)
*H01R 13/17* (2006.01)
*B81B 1/00* (2006.01)

(52) U.S. Cl.
CPC ......... *H01R 12/724* (2013.01); *H01R 12/721* (2013.01); *H01R 13/17* (2013.01); *H01R 43/16* (2013.01); *B81B 1/00* (2013.01); *B81B 2201/07* (2013.01); *B81B 2207/07* (2013.01); *H01R 2201/06* (2013.01)

(58) Field of Classification Search
CPC .... H01R 12/724; H01R 12/721; H01R 13/17; H01R 13/6582–659; H01R 43/16; H05K 7/1061; H05K 7/1069
USPC .......................................................... 439/296
See application file for complete search history.

(56) References Cited

U.S. PATENT DOCUMENTS

| | | | | |
|---|---|---|---|---|
| 6,016,254 A | * | 1/2000 | Pfaff ..................... | H05K 7/1069 361/767 |
| 7,264,486 B2 | * | 9/2007 | Ma ..................... | H01R 13/2442 439/83 |
| 7,993,145 B1 | * | 8/2011 | Howell .................. | H01R 12/57 439/71 |
| 2003/0119361 A1 | * | 6/2003 | Figueroa .............. | H05K 7/1061 439/607.36 |
| 2010/0136833 A1 | * | 6/2010 | Zwanger .............. | H01R 13/516 164/113 |

(Continued)

*Primary Examiner* — Tulsidas C Patel
*Assistant Examiner* — Thaslimur Rahman
(74) *Attorney, Agent, or Firm* — Alliance IP, LLC

(57) ABSTRACT

A microelectronic socket structure and a method of forming the same. The socket structure comprises: a socket structure housing defining a cavity therein; and an interconnection structure including: a contact element disposed at least in part within the cavity, and configured to be electrically coupled to a corresponding microelectronic package, the contact element corresponding to one of a signal contact element or a ground contact element; and a conductive structure disposed at least in part within the cavity, electrically coupled to the contact element, and having an outer contour that is non-conformal with respect to an outer contour of the contact element.

25 Claims, 18 Drawing Sheets

(56) References Cited

U.S. PATENT DOCUMENTS

| | | | |
|---|---|---|---|
| 2011/0287671 A1* | 11/2011 | Ihara | H01R 13/2435 439/709 |
| 2015/0280367 A1* | 10/2015 | Dobrick | H01R 13/6463 439/607.41 |
| 2020/0328558 A1* | 10/2020 | Kasar | H01R 13/6205 |

* cited by examiner

Customizable socket/connector pin feature in an example of cylindrical pin

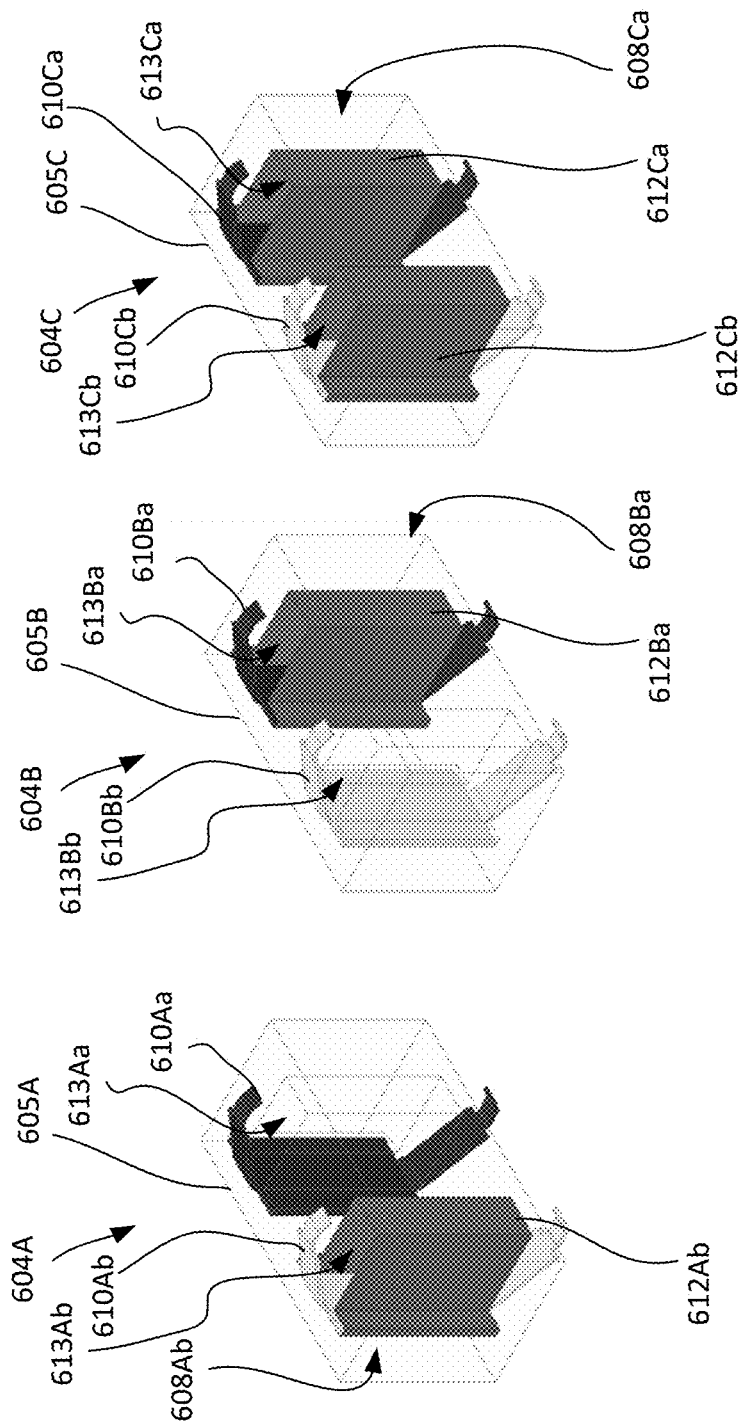

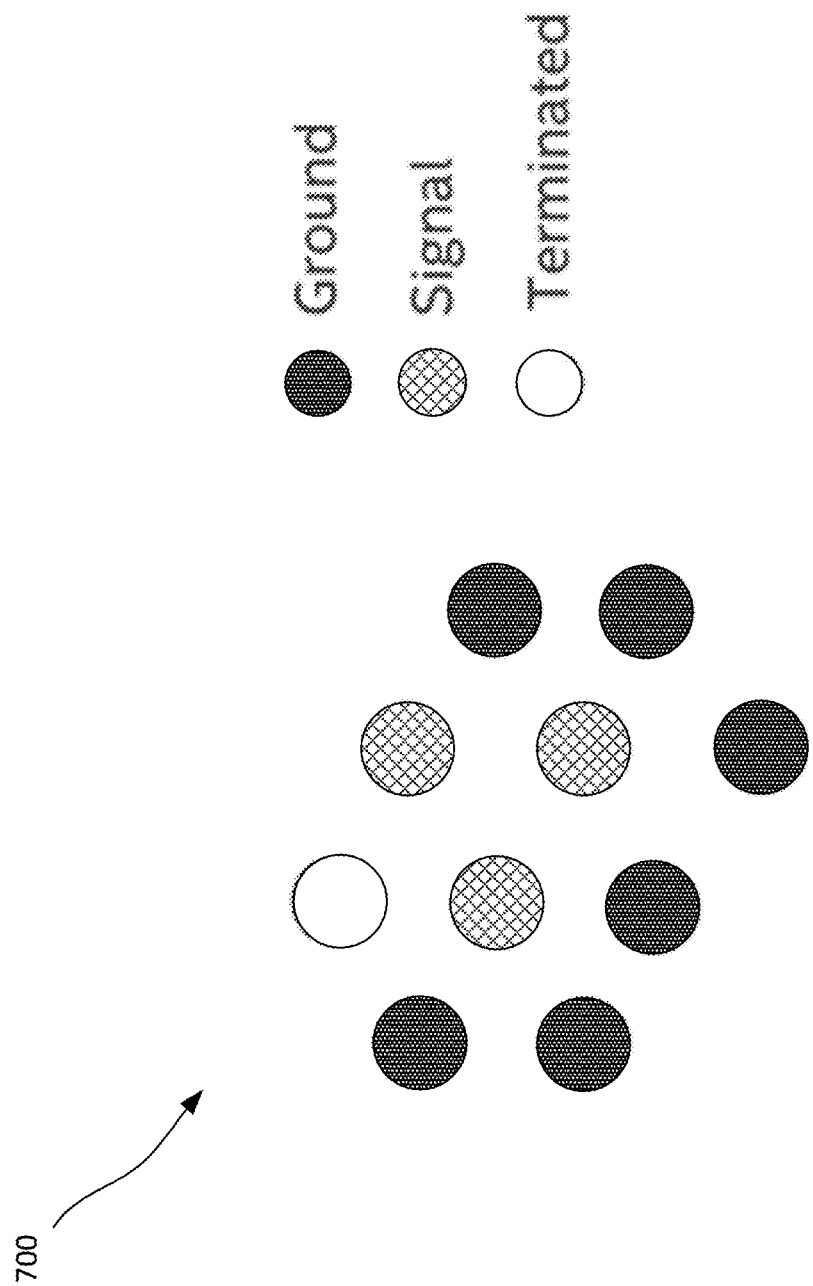

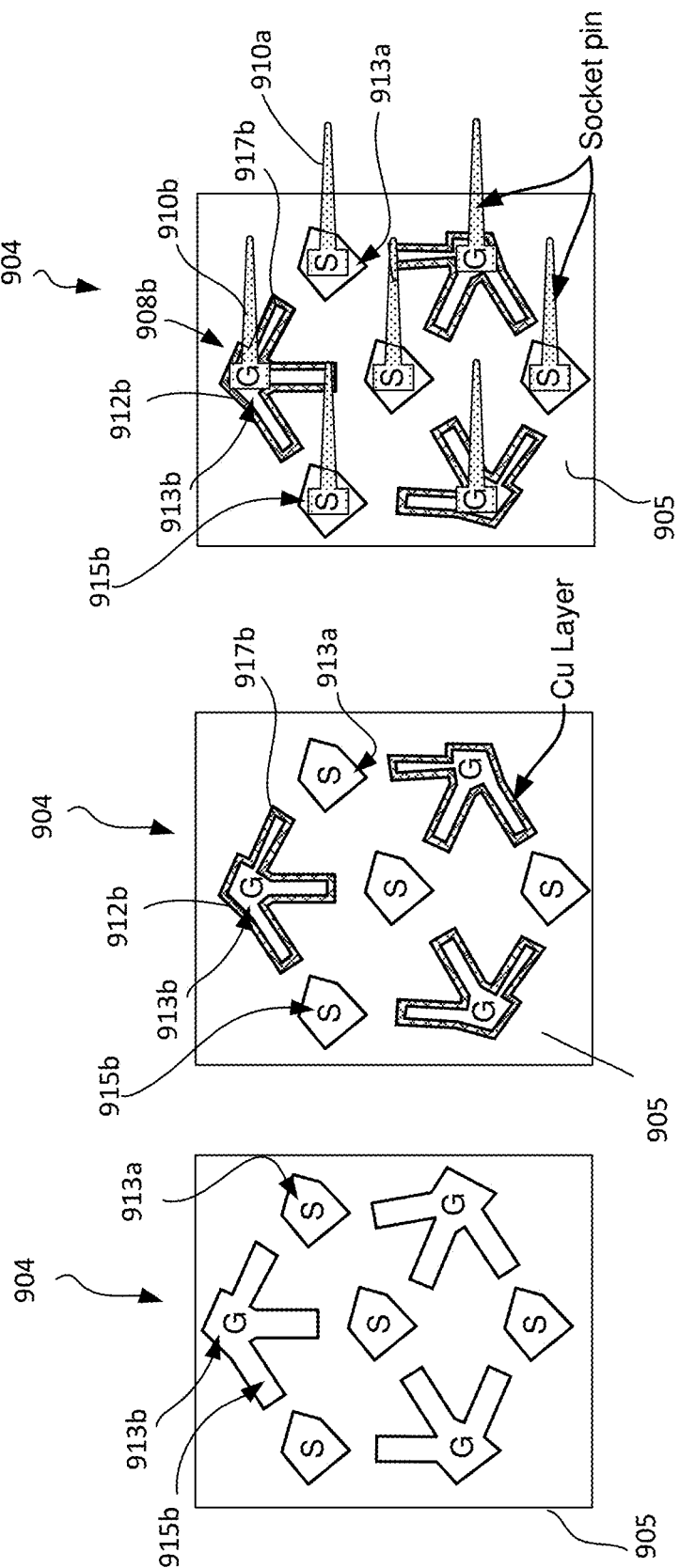

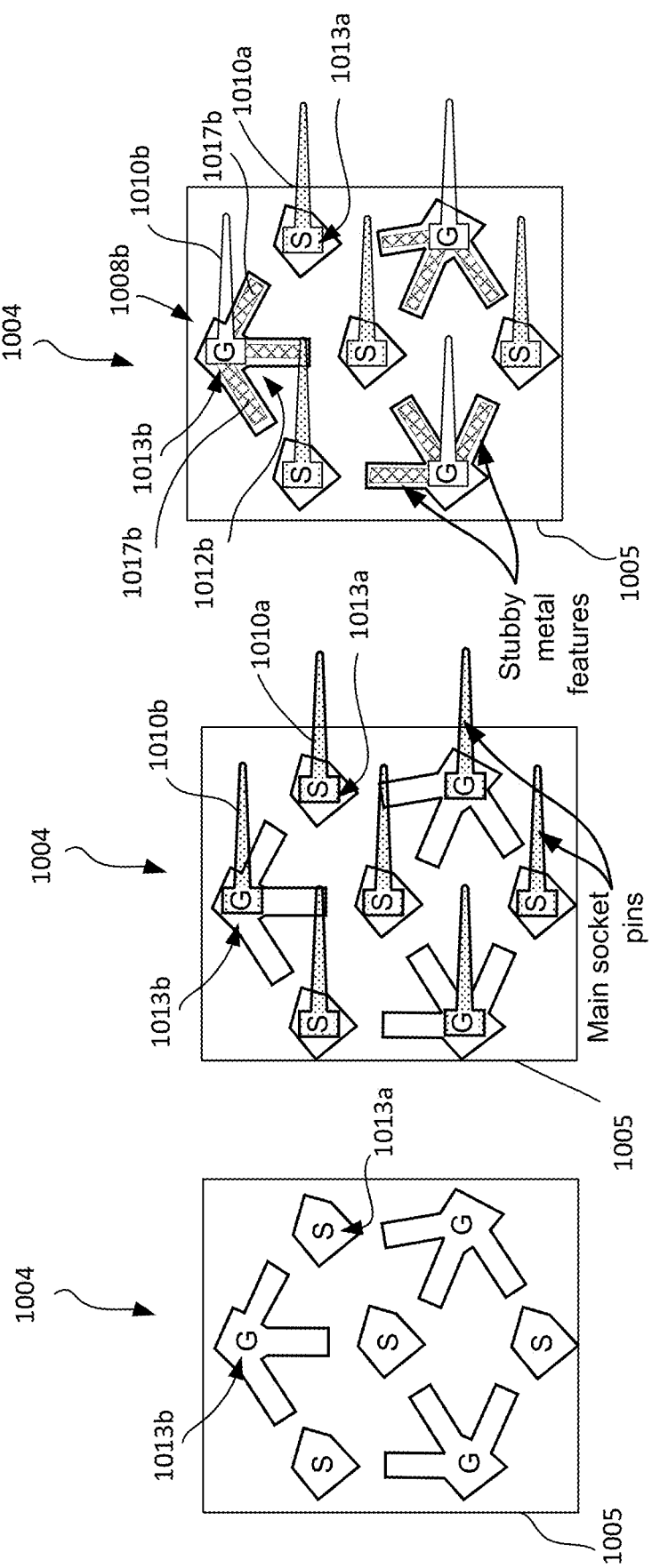

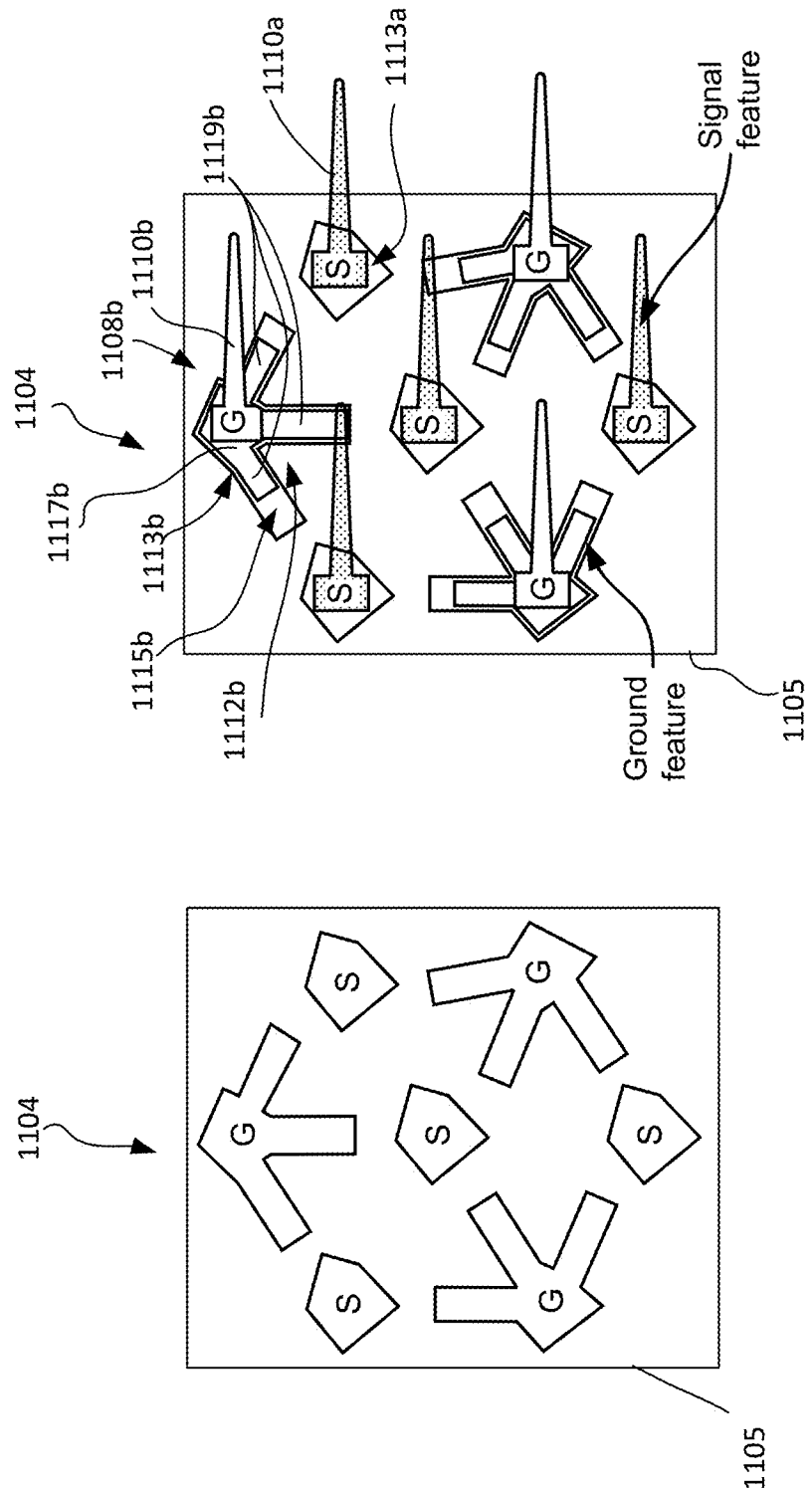

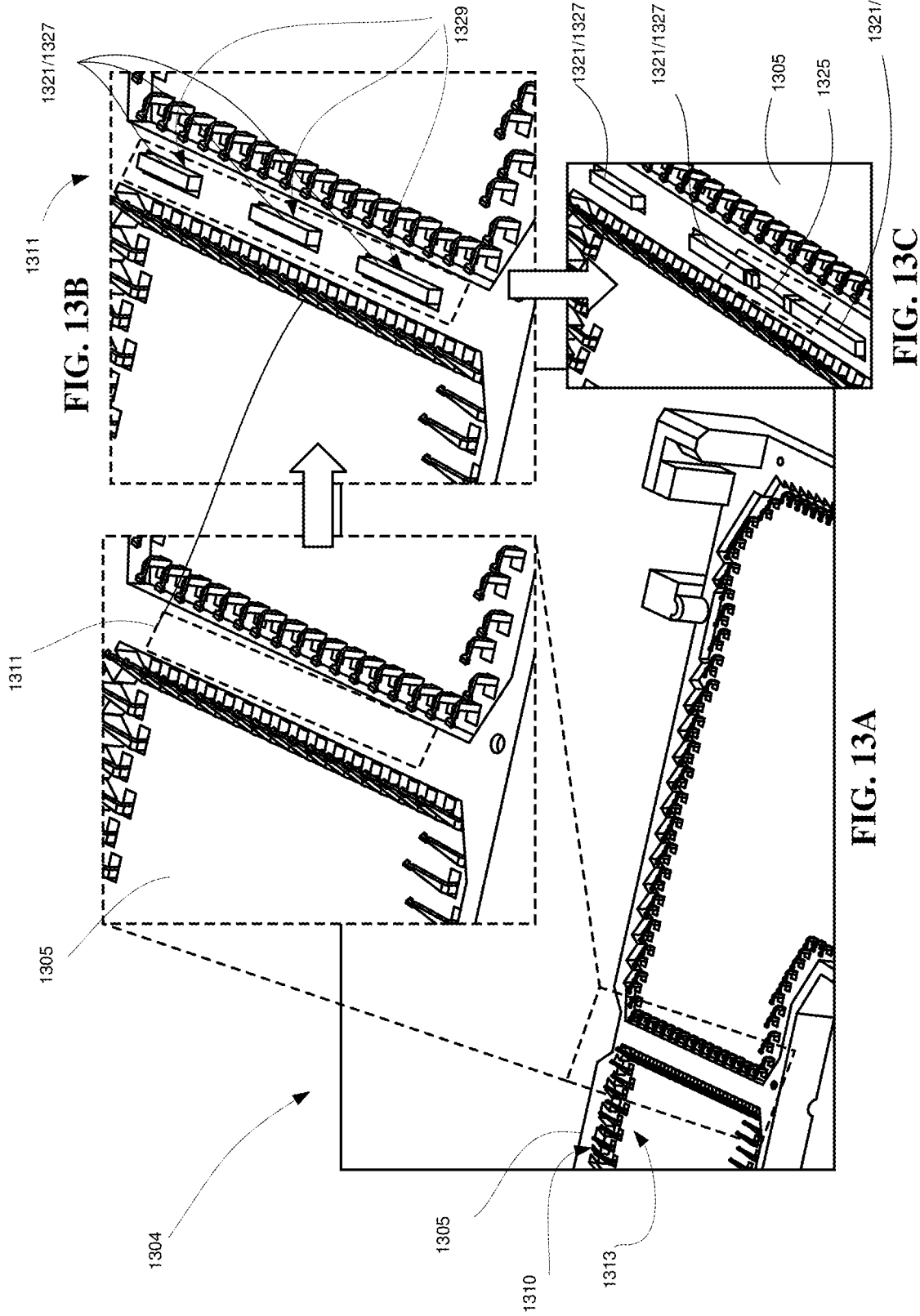

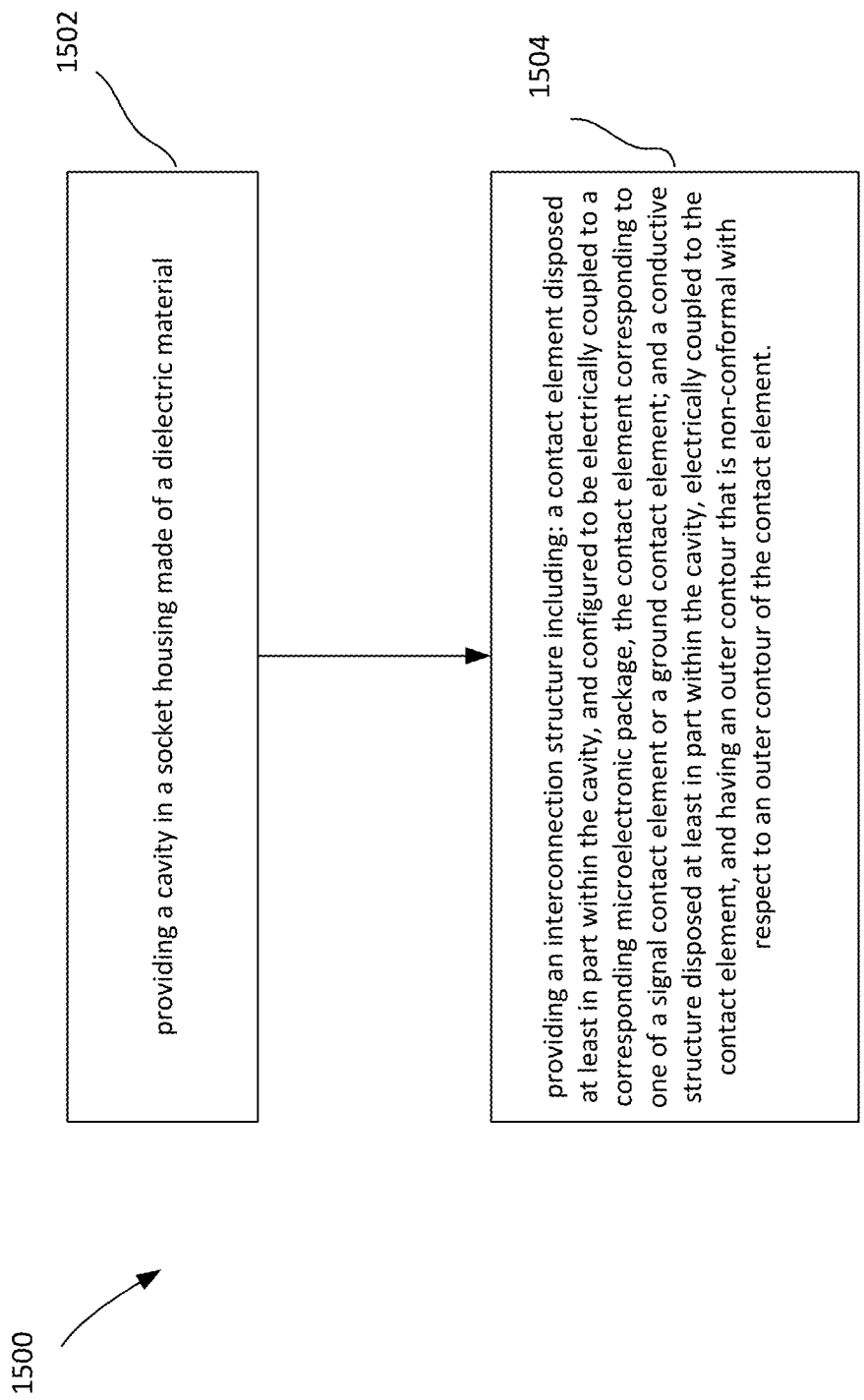

HETEROGENOUS SOCKET CONTACT FOR ELECTRICAL AND MECHANICAL PERFORMANCE SCALING IN A MICROELECTRONIC PACKAGE

TECHNICAL FIELD

This disclosure relates generally to sockets for electronic devices. Some embodiments are related to enhancing tuning to modulate electrical properties of the socket without affecting its mechanical properties.

BACKGROUND

The variety of electronic devices such as computers, smartphones and other electronic communication devices that rely on microelectronics continue to grow, as does the desire for increased processing power. The complexity and density of the circuitry also continues to grow, leading to a number of design and processing issues.

As bandwidth demands for future generations of dynamic data rate (DDR) memory and peripheral component interconnect express (PCIe) technology increase, improved design of the individual components of input/output (I/O) channels to meet the desired mechanical and electrical performance specifications is required. A socket that interconnects a microelectronic package to a motherboard, for example, may significantly contribute to channel loss and cross talk, thereby limiting channel margin at higher speeds. Thus, improving socket design enables interconnect technology for future high speed links, such as high speed DDR and PCIe links.

BRIEF DESCRIPTION OF THE DRAWINGS

FIGS. 6A-6C are respective perspective views of three socket structure designs including interconnection structures according to some embodiments.

FIG. 7 shows a socket pinmap that may be used to implement a socket structure according to embodiments.

FIGS. 9A-9C illustrate respective stages of a process to form an embodiment of an interconnection structure where the conductive structure includes a conductive coating on interior walls of ground pin cavities of a socket structure housing.

FIG. 10A-10C illustrate some respective stages of a process to form an embodiment of an interconnection structure where the conductive structure includes an insertable conductive structure insertable into the cavity of the socket structure housing.

FIG. 11A-11B illustrate some respective stages of a process to form an embodiment of an interconnection structure where the conductive structure includes an insertable conductive structure insertable into the cavity of the socket structure housing.

FIGS. 13A-13C illustrate respective stages of a process to form an embodiment of a socket structure including tuning features at a free location of the socket structure housing.

FIG. 15 is a flow chart of a process according to some embodiments.

DESCRIPTION OF EMBODIMENTS

Figure 1:
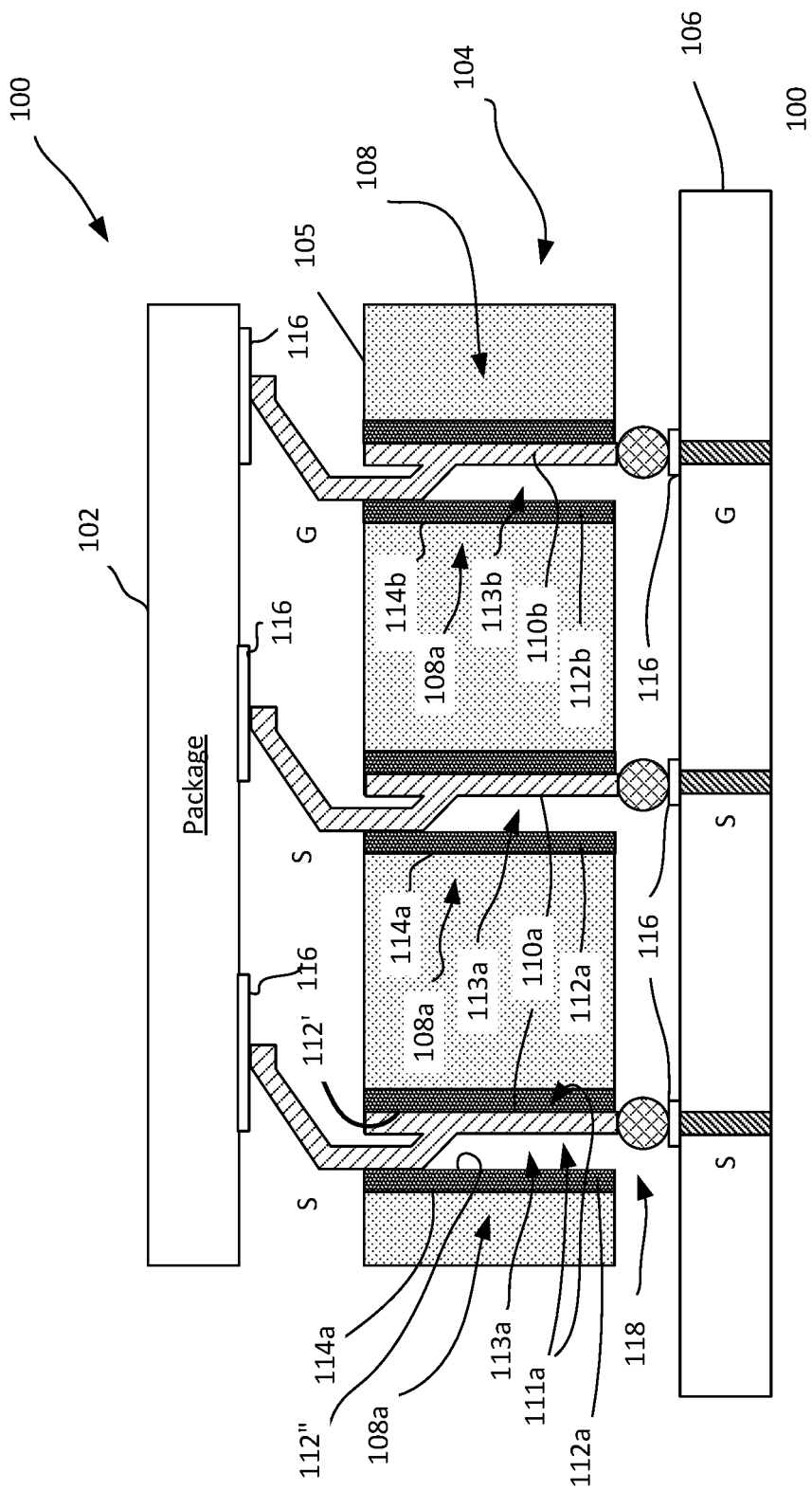
FIG. 1 illustrates a cross-sectional view of a socket structure in accordance with an embodiment.

Some embodiments provide a heterogeneous socket structure that advantageously results in a tuning of features of interconnection structures within housing cavities of the socket structure in order to provide a modulation of the electrical properties of the socket structure without affecting the mechanical properties of the same. In current socket structures, tuning a given parameter such as beam width, beam thickness, etc. would not scale in the same manner for both mechanical and electrical requirements concerning the socket structures. Tuning outcomes may be positive for one type of requirement, and usually negative for the other. Embodiments obviate the above conflict and provide a more feasible solution space as will be described in further detail below.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation. In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an ASIC, an electronic circuit, a SOC, a processor (shared, dedicated, or group), and/or memory (shared, dedicated, or group) that execute one or more software or firmware programs, a combinational logic circuit, and/or other suitable components that provide the described functionality.

As above, a number of complexities arise with the increasing demand for speed and memory of electronics. This demand may result in an increase in the number of I/O signal pins in electronics packages, notably for central processing units (CPUs), but also for other circuit components. An increase in the number of signal pins also increases the number of ground pins to provide an effective return path and to reduce crosstalk for high speed signaling. In different examples, the number of ground pins to signal pins range from 1:6 to 2:1. This increase in signal and ground pins leads to increase in both package size for the microelectronic component and total enabling load for Land Grid Array (LGA) socket architecture. For server applications, the total CPU pin count may be greater than 8000-9000 in the next few generations. Unfortunately, increasing the size and total socket load drives up the packaging cost and technical complexity and is not sustainable and scalable for next generation products.

The prior art provides uniform connector design for all socket pins, and relies on pin geometry design and pin map to achieve desirable electrical performance. The prior art further proposes to reduce socket structure height in order to scale electrical performance, and to add shielding features in socket housings to provide crosstalk mitigation. However, socket structure height reduction can increase mechanical challenges to meet working ranges for a microelectronic system including the socket, and can put further demand on power delivery capacitor heights and capacitance values. In addition, relying solely on pin geometry design and the associated pinmap to achieve electrical and mechanical targets convergence is time consuming and difficult to scale given that manufacturing is currently reaching its technology limits. Prior art manufacturing processes further use a stamped metal process to form pins, with metal thickness and design complexity limitations. In addition, where a brute force solution to provide loss and crosstalk mitigation through only ground feature engineering is provided, there is the ever present lack of full flexibility in available contact geometries for a given microelectronic system.

Some embodiments provide a novel socket structure and a method of forming the same. According to some embodiments, the socket structure is heterogeneous, in that it includes one or more interconnection structures that are configured such that they help decouple electrical challenges (including the need to mitigate loss, reflection and crosstalk) and mechanical challenges (including the need to provide contact elements within a given geometry). Thus, some embodiments help to reset scaling curves approaching technology limits with respect to such challenges.

According to some embodiments, an interconnection structure (i.e. a conductive feature), may include distinct building blocks, such as a contact element (such as a pin) on the one hand, and a conductive structure on the other hand that is in contact with the pin. The conductive structure has an outer contour or outer shape that is non-conformal with respect to an outer contour of the contact element.

According to some embodiments, the contact element and the conductive structure may be made using different processes. For example, a pin may be made of a stamped metal (e.g. copper) that may be coated conformally with gold and/or nickel for connection reliability and anti-oxidation. The conductive structure may be coated (such as, by way of example, printed or sprayed or plated) onto the cavity walls of the socket housing, or it may be provided as an insertable conductive structure that is insertable into the cavity of the socket housing. Where the conductive structure is insertable, it may, according to one embodiment, include, for each socket housing cavity, one or more insertable conductive stubs, or one or more insertable stubby features. One or more insertable conductive stubs may be inserted into a cavity of the socket housing such that they are in contact with the corresponding pin. Where the conductive structure is insertable, it may, according to another embodiment, include, for each socket housing cavity, a recessed conductive body that may be formed using any suitable process, such as extrusion, and that may define a recess therein to receive the contact element. The combination of the contact element inserted into the recessed conductive body would form an interconnection structure according to an embodiment.

Advantageously, providing a socket connector with distinct building blocks as described herein removes the bottleneck, inherent in the use of a single metal stamping process of the prior art, of meeting electrical and mechanical requirements of socket structure fabrication. The proposal allows flexible connector customization and high speed performance scaling with reduced design challenges and cycle.

Although the instant description may sometimes refer to contact elements and pins interchangeably, it is to be understood that embodiments are not so limited, and include within their scope contact elements other than pins. Therefore, an instance where a "pin" is referenced in the description may be interpreted as an instance that is to include a broader reference to a "contact element."

FIG. 1 illustrates a cross-sectional of a microelectronic system 100 in accordance with some embodiments. The system includes a microelectronic package 102 in electrical and mechanical contact with a socket structure 104. The socket structure connects the package 102 with a motherboard 106. The socket structure 104 may be designed to provide electrical connection between a motherboard 110 and an electronic package 102 through one or more types of interconnection structures, such as signal (S) or ground (G) interconnection structures 108 as shown.

The socket structure 104 may comprise a socket housing 105 that includes an insulator body, which may be a single solid material or formed from multiple individual insulating layers. The socket housing 105 may for example be formed from a polymer, liquid crystal polymer, polyimide, acrylic, FR4, glass flow, printed circuit board laminate or other electrically insulating material with appropriate dielectric constants and loss tangents meeting electrical performance requirements.

Interconnection structures 108 may be provided in the socket housing 102. These interconnection structures 108 may include signal interconnection structures 108a and ground interconnection structures 108b. In the description to follow, a reference numeral ending with the letter "a" is to pertain to a signal interconnection structure 108a, and a reference numeral ending with the letter "b" is to pertain to a ground interconnection structure 108b. A interconnection structure 108a/108b may thus include, according to one embodiment, a pin 110a/110b, the pin housed in a cavity 113a/113b of socket housing 105. Socket housing 105 as shown defines cavities 113a/113b having interior sidewalls 114a/114b. A interconnection structure 108a/108b includes, in addition to a pin 110a/110b, a conductive structure 112a/112b. In the shown embodiment, the conductive structure 112a/112b includes a surface 112' in contact with the pin 110a/110b, and an opposing surface 112" that is non-conformal with respect to the pin 110a/110b. In particular, by way of example, conductive structure 112a has a contacting surface 112' in contact with a first side of outer contour 111a of the pin 110a, and an opposing surface 112" opposite the contacting surface 112'. Surface 112" contacts a second side of outer contour 111a of the pin 110a, the second side different from the first side. Surface 112" has a different contour than the second side of outer contour 111a of the pin 110a. Thus, the conductive structure 112a has an inner contour that is different, or non-conformal, with an outer contour 111a of the pin 110a.

According to some embodiments, conductive structure 112a/112b may be a conductive coating on inner/interior walls 114a/114b of the cavity 113a/113b of socket housing 105, or it may include one or more structures inserted into the cavity 113a/113b and in contact with and separate from the pin 110a/110b. Where a coating is provided as the conductive structure 112a/112b, the coating may be provided on at least a portion of interior sidewalls 114a/114b, including a provision of the coating such that is fully covers the interior sidewalls 114a/114b.

The package and motherboard of system 100 may each include surface contacts 116 thereon, such as pads, to provide an electrical connection with other components of the system. In the shown embodiment, solder balls 118 are provided between the pins 110a/110b and surface contacts 116 of motherboard 106 to provide an electrical coupling therewith.

The pins, contacts, and/or conductive structure may be made of one or more conductive materials. "Conductive" as used herein means electrically conductive. Examples of these conductive materials may include, among others, copper (Cu), aluminum (Al), gold (Au), silver (Ag), nickel (Ni), palladium (Pd) or tungsten (W). Further examples may include brass, bronze, iron, platinum, steel, lead or stainless steel. The pins 110a/110b may for example be made of a copper alloy, and plated with nickel and/or gold. The socket housing may include a dielectric material (made of one or more types of dielectric materials), or any other material with electrically insulating properties similar to that of a dielectric material.

Although pins 110a/110b as shown have a specific shape and attachment mechanisms, embodiments are not so limited, and include within their scope the provision of a pin of any shape or attachment mechanism as would be within the knowledge of a skilled person.

The signal connections S may be connected to motherboard-side signal surface contacts 116 on one surface of the socket structure 104 and package-side signal surface contacts 116 on an opposing surface of the socket structure 104. Similarly, the ground connections G may be connected to motherboard-side ground surface contacts 116 on one surface of the socket structure 104 and package-side ground surface contacts 116 on an opposing surface of the socket structure 104. The motherboard-side signal contacts and motherboard-side ground contacts may be configured to be connected to signal and ground lines, respectively, in the motherboard 106. The package-side signal contacts S and package-side ground contacts G may be configured to be connected to signal and ground connections, respectively, of the package 102 or socket structure 104. The motherboard-side and package-side signal and ground surface contacts 116 may be planar on the surface on which they are disposed and formed from the same conductive material as above, e.g., Cu. The signal and ground connections of the package or socket may be, for example, pins of the package or socket or contacts of the socket.

The interconnection structures 108 in the socket structure 104 may decouple the contact mapping between the package and the motherboard and additionally create pitch translation. Accordingly, some of the signal connections and even some ground connections may extend vertically straight through the socket structure 104 such that the motherboard-side signal contacts and package-side signal contacts are aligned, while others may not be straight (e.g., are laterally routed in at least one location between the motherboard-side signal contacts and package-side signal contacts to run parallel with the surface of the socket structure 104). The socket structure 104 may effectively preserve the same pin pattern, signal to ground (S:G) ratios and design rules at motherboard side interconnections. This may retain signal integrity in the motherboard. By the same token, the socket structure 104 may allow the use of higher S:G ratios on the package side interconnection by replacing some of the ground connections G with ground shield vias (not shown). In this case, the number of ground pins of the package may be reduced without reducing the number of ground connections in the socket structure 104 and motherboard. This may enable an increased package pin count and/or a size reduction of the package.

Socket contact technologies such as dual land grid array (LGA), or Low Insertion Force (LIF) or Pin Grid Array (PGA) structures may further be used for the socket structure 104, although other contact array structures are within the scope of embodiments. Although solder balls are shown in FIG. 1. Embodiments further contemplate the use of other conductive components to electrically couple the socket structure 105 to motherboard 106.

A scalable and effective way to improve the socket structure or connector performance is to make its structure and behavior similar to those of a transmission line. Thus, to control impedance, loss and crosstalk, one may design pin dimensions and signal to ground spacing properly, including ensuring such spacing is within the pitch limit. One may further maximize the signal to signal spacing to control crosstalk in a monotonically changing distance range, and additionally maximize the geometry transverse uniformity along a longitudinal direction of the pins. However, in a conventional socket structure design process, all pins have a uniform geometry, are usually made using a stamped metal process. When using non-uniform pin geometries in a uniform grid pinmap, challenges arise including: (1) an optimal distance between signal to signal interconnection structures and signal to ground interconnection structures may not match; (2) a non-uniform pin geometry may result in pins interacting with one another differently based on the direction of interaction; and (3) optimizing adherence to electrical and mechanical requirements may prove challenging.

To overcome challenges of the prior art, some of which have been noted herein, some embodiments propose to construct a socket structure which includes at least one interconnection structure that has distinct parts (or building blocks): a contact element, such as a pin, and a conductive structure contacting (conductively connected to) the contact element. The building blocks may be made in multiple distinct processes, or they may be made using a same or similar process. In one embodiment, the conductive structure may directly contact the contact element for an electrical coupling therebetween. In another embodiment, the conductive structure may contact the contact element for an electrical coupling therebetween by way of another body or structure therebetween. The conductive structure may address electrical requirements for the socket structure, and its placement and configuration may be tuned accordingly. For example, the conductive structure may allow a customization of a geometry of electrically conductive features (such as S or G contacts) of the socket structures, such as allowing non-uniform pitch and pinmap definitions.

Usage Models for Ground Pins

An implementation of embodiments for ground interconnector structures include a contact element that includes a conductive mechanical feature, such as a pin made using a stamped metal process, and, in addition, a conductive structure in the form of an insertable conductive structure for electrical purposes. The conductive structure, as will be explained in more detail in the context of FIGS. 9-11, may be made using a number of processes, such as, for example: (1) a conductive coating process (FIG. 9) to form a conductive coated body on interior walls of a cavity of the socket structure housing such that, when a contact element is inserted into the cavity, it is in electrical contact with the conductive coating to form a complete grounding interconnection structure therewith (FIG. 9); (2) using an object fabrication process, such as extrusion by way of example only, to form an insertable conductive structure that may be inserted into a cavity of a housing of the socket structure (FIGS. 10 and 11) such that the insertable conductive structure is in electrical contact with the contact element when the contact element is inserted into the cavity to form a complete grounding interconnection structure. Where the conductive structure is an insertable conductive structure, it may define one or more stubs, or define one or more stubby features or stubby bodies, that may be inserted into a cavity of a housing of a socket structure (FIGS. 10 and 11). The stubs or stubby features may be distinct from the contact element, and separately insertable into the housing cavity of the socket structure (FIG. 10), or they may be unitary with the contact element (fixed to the context element, or forming a one-piece body with the contact element), and inserted together with the contact element as a unitary interconnection structure into the housing cavity of the socket structure (FIG. 11).

An interconnection structure according to embodiments, for examples as shown and described herein, may be configured to tune the impedance of adjacent signal pins and/or to provide additional isolation between signal pins for electrical performance improvement.

Figures 2A, 2B:
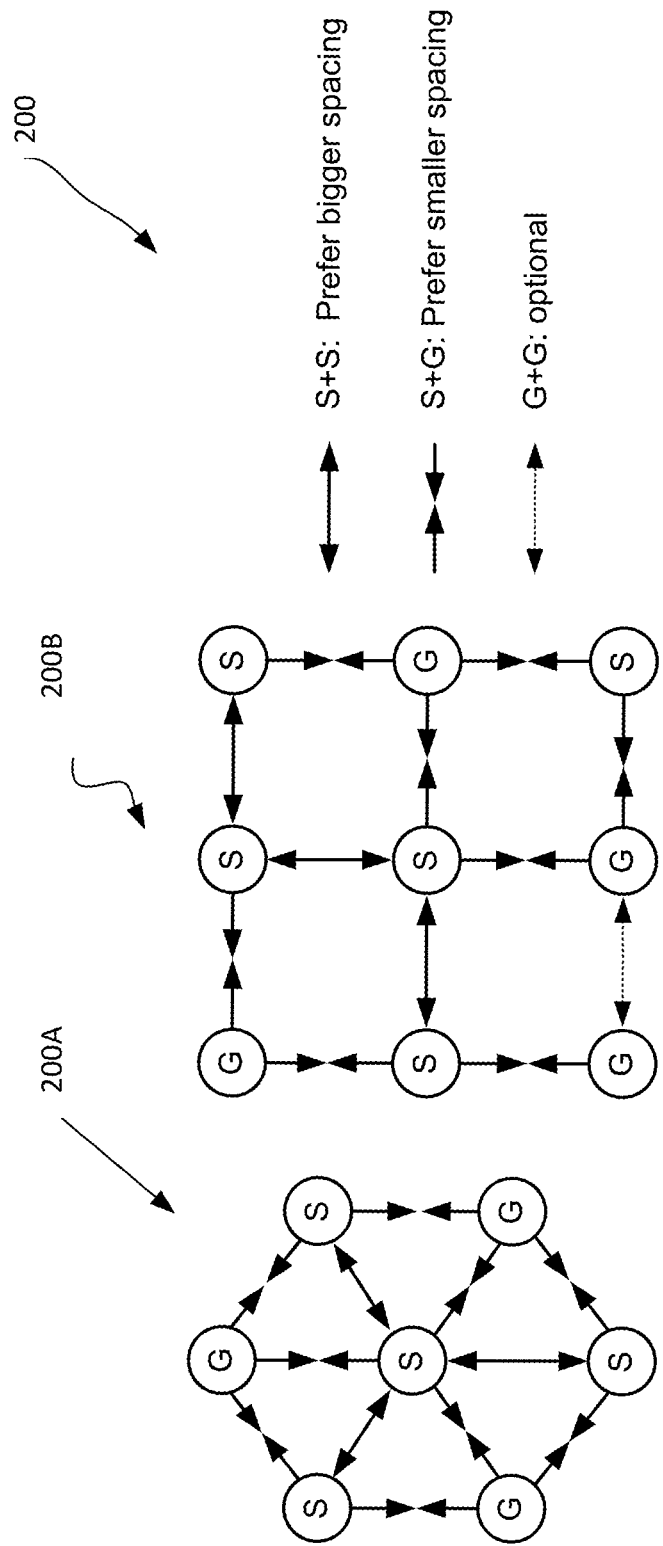
FIG. 2A illustrates a hexagonal pin grid.
FIG. 2B illustrate a square pin grid.

FIGS. 2A and 2B illustrate a principle behind embodiments as shown through some example pin layouts or grids 200A and 200B. FIGS. 2A and 2B show two typical pin grids, with one being hexagonal (200A), and the other square (200B). The shown pin grids of FIGS. 2A and 2B show cylindrical pin designs, although embodiments are not limited to cylindrical pin designs, and can include any pin shape, or any contact element shape, as would be within the knowledge of a skilled artisan. In any given grid shape, any pin may be either a signal (S) pin or a ground (G) pin. Optimization requirements as between S pins and G pins are quite different. In particular, within a given pin pitch limit, it is desirable for the effective spacing between the G pin and the S pin to be smaller, as shown by facing double arrows in FIGS. 2A and 2B, and for the effective spacing between two S pins to be comparatively larger, as shown by a double headed single arrow between S pins.

Figure 3:
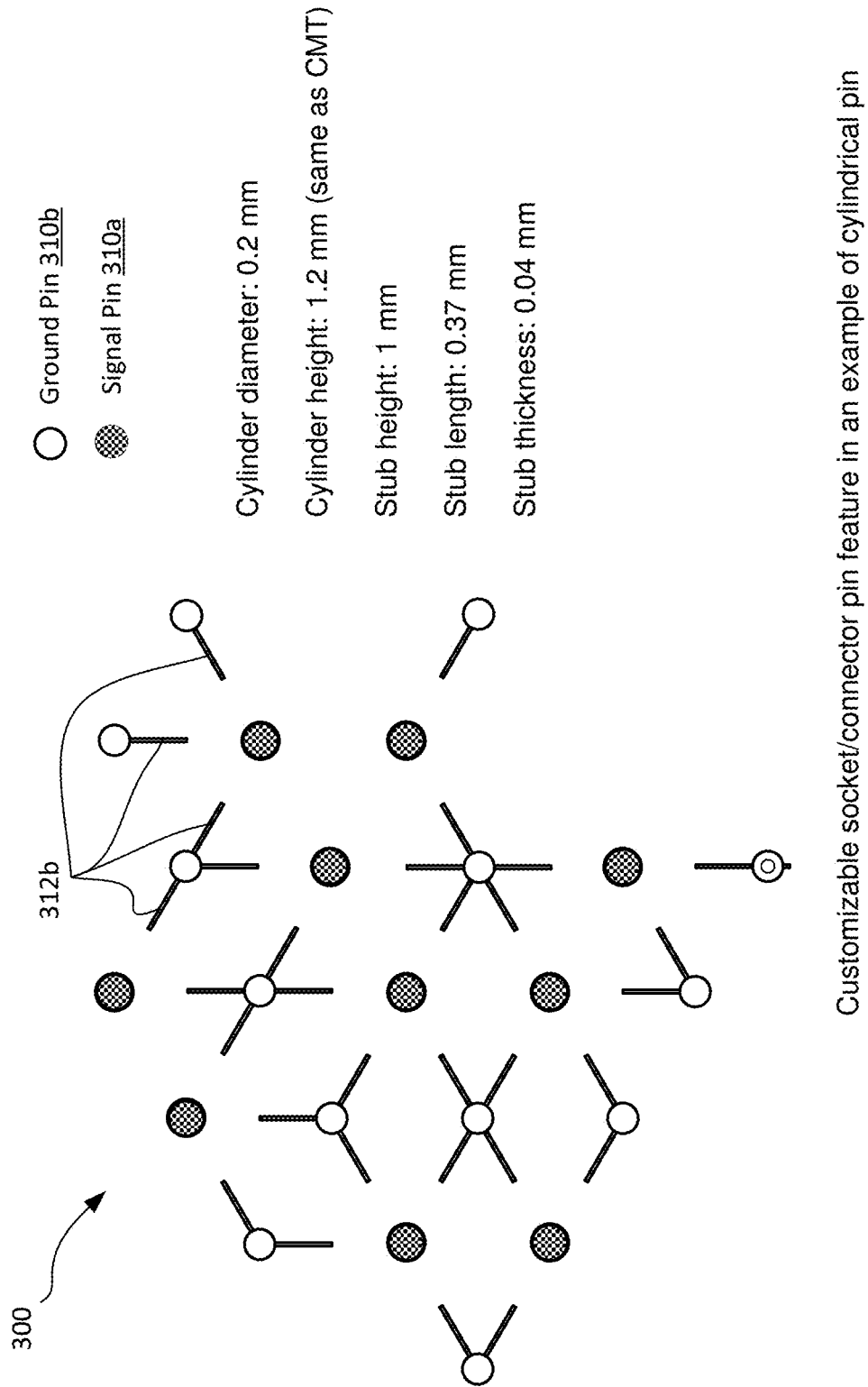
FIG. 3 illustrates a pin grid including interconnection structures according to some embodiments.

FIG. 3 shows a pin grid 300 that uses interconnection structures according to an embodiment. In the example of FIG. 3, interconnection structures 308b including ground pins 310b and conductive structures 312b that include extended conductive stubby features 313b. The stubby features and their positioning within the pin grip ground the ground pins 312b in the directions of respective adjacent signal pins 310b. The extended conductive stubby features 313b may include metal (including metal alloy) stubs that can be formed as metal plates, bent metal loops or other shapes possibly with a conductive coating or alternative metal forming process. The structural configuration of the stubby features including their thickness and length may be designed to achieve the best performance within the pitch constraint of a given pin grid to effectively reduce signal to ground spacing for optimal impedance loss tuning, maintain the signal to signal spacing, and provide additional isolation for non-adjacent pins.

In the example pin grid configuration 300, a cylinder diameter of each pin was 0.2 mm, the cylinder height was 1.2 mm, the stub height was 1 mm, the stub length was 0.37 mm, and the stub thickness was 0.04 mm, with height being measured in a direction perpendicular to the figure, and length being measured in the two dimensional space of the figure.

Figure 4A:
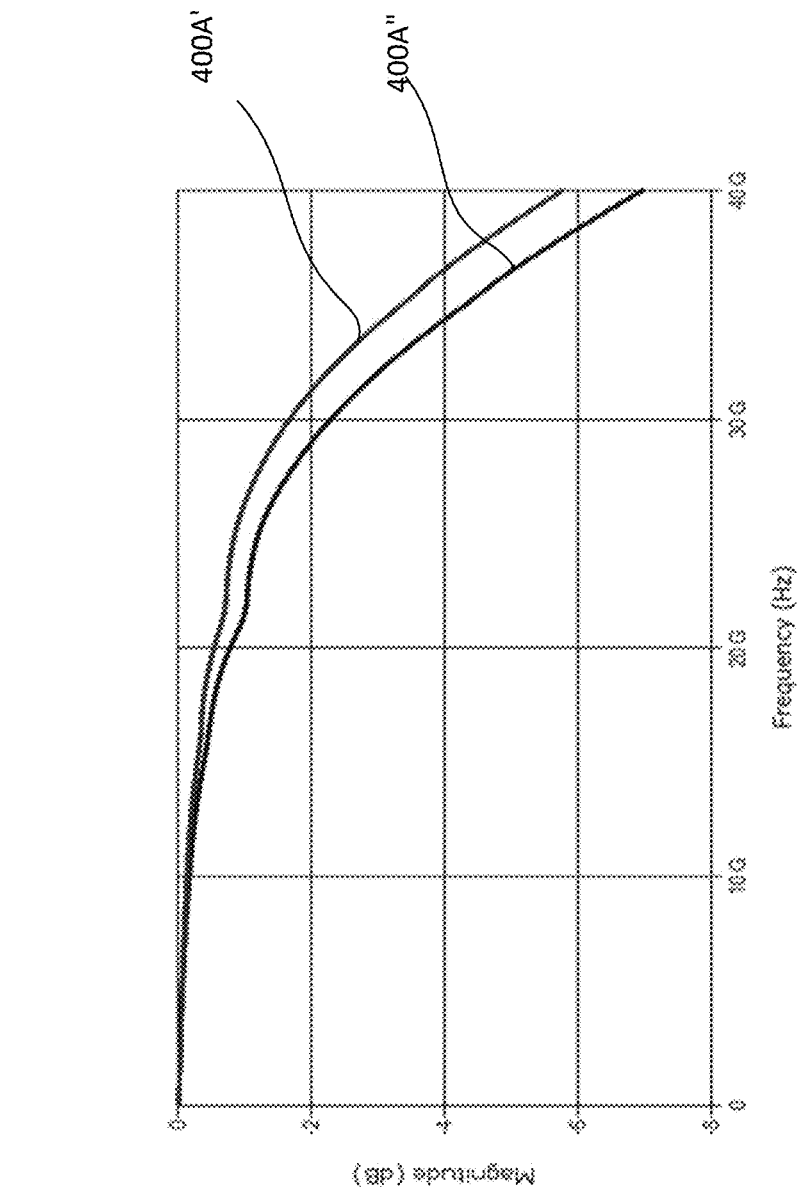
FIG. 4A is a graph of differential insertion loss plotted against frequency simulated for the state of the art, and for a socket structure according to an embodiment.

FIG. 4A is a graph 400A of the differential insertion loss in Decibels (dB) plotted against frequency in Hertz (Hz) simulated for prior art (plotted as 400A') and for example socket structures according to some embodiments as shown in FIG. 3 (plotted as 400A").

Figure 4B:
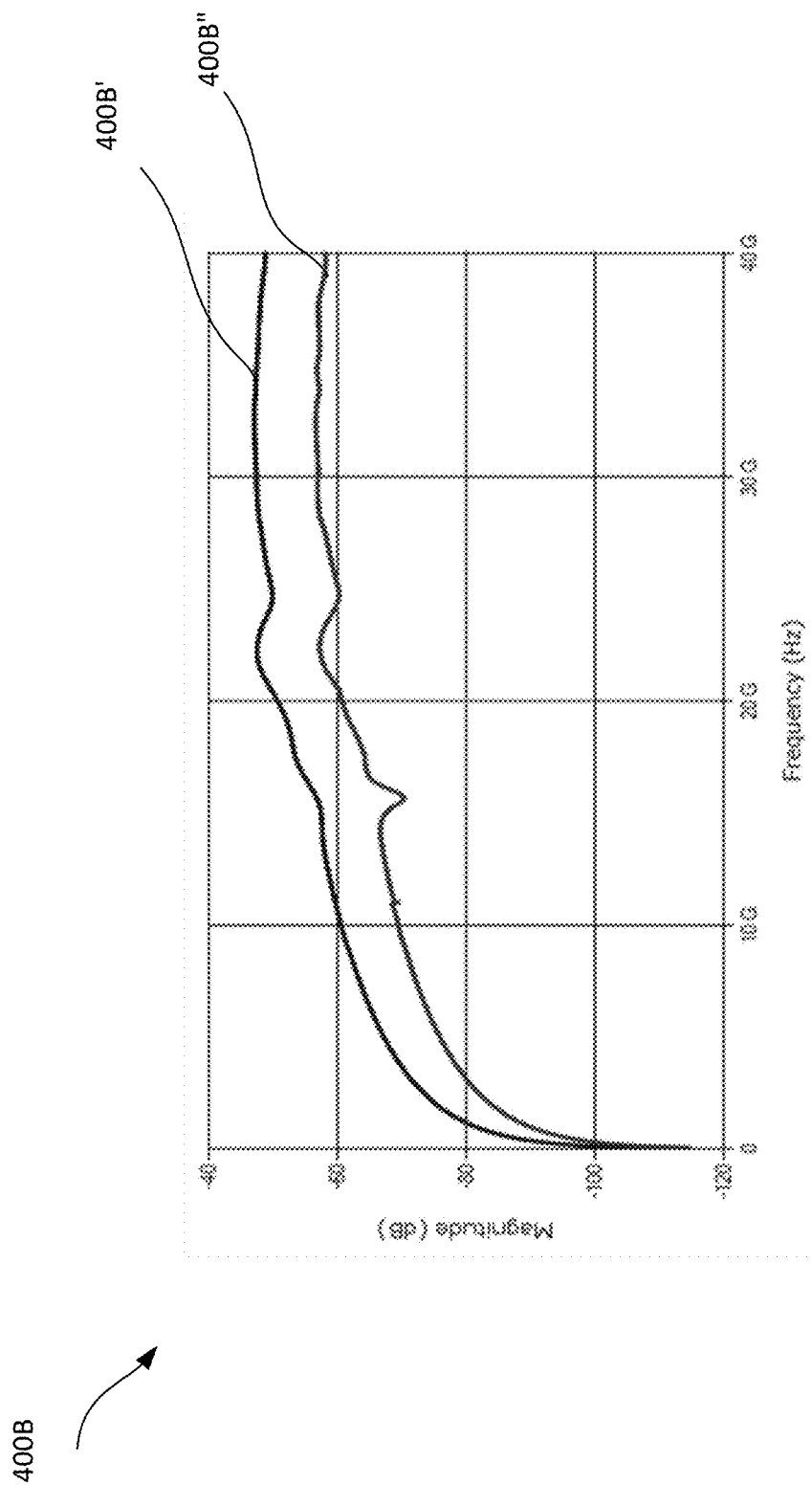
FIG. 4B is a graph of the crosstalk in dB plotted against frequency simulated for the state of the art, and for a socket structure according to some embodiments.

FIG. 4B is a graph 400B of the crosstalk in dB plotted against frequency in Hz simulated for prior art (plotted as 400B′) and for example socket structures according to some embodiments as shown in FIG. 3 (plotted as 400B″).

FIGS. 4A and 4B show that interconnection structures according to some embodiments as shown in FIG. 3 can effectively achieve a reduction of about 15% in insertion loss and >=10 dB in crosstalk to improve signaling scalability. No resonance is observed up to at least 40 GHz. This indicates that an extended metal stub extending from ground pins serves as a reference for signal pins, and cause them to behave similar to well-referenced transmission lines as well as providing additional crosstalk mitigation.

Figure 5:
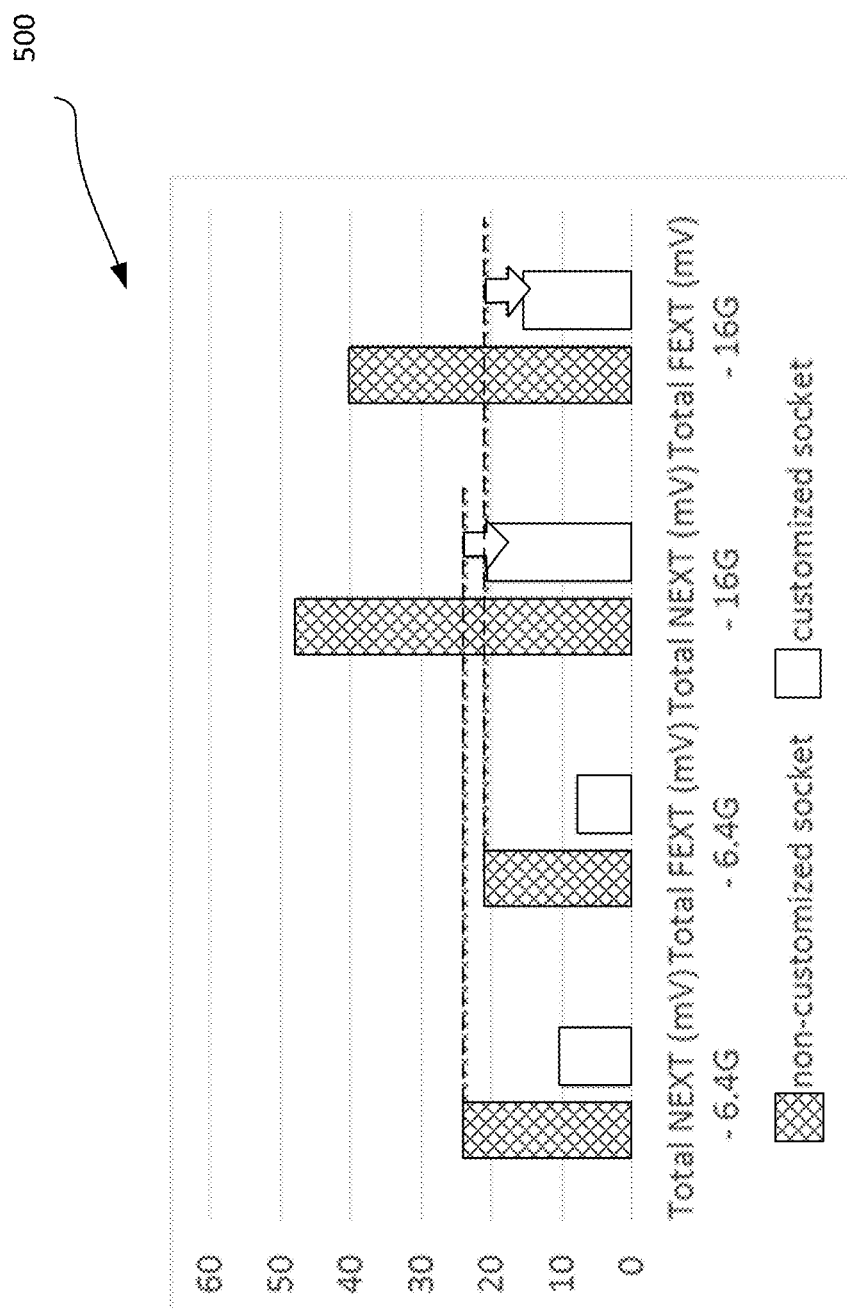
FIG. 5 is a bar graph of next-end crosstalk (NEXT) and far-end crosstalk (FEXT) for various interconnection structures according to some embodiments.

FIG. 5 is a bar graph 500 showing that interconnection structures according to some embodiments as shown in FIG. 3 can achieve good crosstalk improvement and can support data rate scaling. For the same data rate, proposed interconnections structures as shown in FIG. 3 can reduce the crosstalk by ~70%. Even with the data rate scaling from 6.4 Gbps to 16 Gbps, the crosstalk with the interconnection structures of FIG. 3 would be lower than the state of the art one at 6.4 Gbps. The above means that the same design can support a wide range of memory data rate scaling, and that a same socket technology can be used over multiple generations for significant enabling efforts and cost reduction.

Usage Model for Signal Pins

Other embodiments for an interconnection structure may relate to the use of such structures for signal pins in addition to ground pins as will be described in further detail below.

FIGS. 6A, 6B and 6C are respective perspective views of three socket structure designs including interconnection structures according to some embodiments.

In the example embodiment of FIG. 6A portions of respective socket structures 604A are shown, where socket structure 604A includes a housings 605A, the housings defining respective cavities therein, where cavity 613Aa corresponds to a housing cavity into which a signal pin 610Aa is inserted, and cavity 613Ab corresponds to a housing cavity into which a ground pin 610Ab is inserted. In the embodiment of FIG. 6A, an interconnection structure 608Ab including ground pin 610Ab and a conductive structure 612Ab inside the cavity 613Ab. The conductive structure 612Ab may be provided by way of a conductive coating on inner walls of the housing cavity 613Ab, the conductive structure forming a conductive coated body being electrically coupled or connected to the corresponding socket pin, in this case ground pin 610Ab. In the shown embodiment of FIG. 6A, the signal pin 610Aa is not associated with a conductive structure, and is directly inserted into its corresponding cavity 613Aa.

In the example embodiment of FIG. 6B portions of respective socket structures 604B are shown, where socket structure 604B includes a housings 605B, the housings defining respective cavities therein, where cavity 613Ba corresponds to a housing cavity into which a signal pin 610Ba is inserted, and cavity 613Ba corresponds to a housing cavity into which a ground pin 610Bb is inserted. In the embodiment of FIG. 6B, an interconnection structure 608Ba includes signal pin 610Ba and a conductive structure 612Ba in the form of a conductive coated body inside the cavity 613Ba. The conductive structure 612Ba may be provided by way of a conductive coating on inner walls of the housing cavity 613Ba, the conductive structure being electrically coupled or connected to the corresponding socket pin, in this case signal pin 610Ba. In the shown embodiment of FIG. 6B, the ground pin 610Bb is not associated with a conductive structure, and is directly inserted into its corresponding cavity 613Bb.

In the example embodiment of FIG. 6C portions of respective socket structures 604C are shown, where socket structure 604C includes a housings 605C, the housings defining respective cavities therein, where cavity 613Ca corresponds to a housing cavity into which a signal pin 610Ca is inserted, and cavity 613Cb corresponds to a housing cavity into which a ground pin 610Cb is inserted. In the embodiment of FIG. 6C, an interconnection structure 608Ca includes signal pin 610Ca and a conductive structure 612Ca inside the cavity 613Ca. The conductive structure 612Ca may be provided by way of a conductive coating on inner walls of the housing cavity 613Ca, the conductive structure corresponding to a conductive coated body that is electrically coupled or connected to the corresponding socket pin, in this case signal pin 610Ca. In the embodiment of FIG. 6C, an interconnection structure 608Cb includes ground pin 610Cb and a conductive structure 612Cb inside the cavity 613Cb. The conductive structure 612Cb may be provided by way of a conductive coating on inner walls of the housing cavity 613Cb, the conductive structure being electrically coupled or connected to the corresponding socket pin, in this case ground pin 610Cb. In the shown embodiment of FIG. 6C, both the signal pin 610Ca and the ground pin 610Cb are associated with a respective conductive structure, and are part of respective interconnection structures according to some embodiments.

According to some embodiments, geometries of the cavity of the socket structure housing may be customized, while the conductive coating such as the one referred to in the context of FIGS. 6A-6C may also be customized so as to allow at least one of: (1) a tuning of effective electrical distances between socket pins and ground pin to adjust a spatial capacitance and inductance (Z) between the same; (2) achieving a desired impedance, next-end crosstalk (NEXT) and far-end crosstalk (FEXT) between the same; (3) maintaining pitch requirements in the pin grid; and/or (4) providing additional flexibilities to relax stresses on the package design.

FIG. 7 shows a socket pin map 700 including ground pins 710b, signal pins 710a and terminated pins 710c. The pin map of FIG. 7 was used as a basis for electromagnetic simulations of the behavior of the three socket structure configurations of FIGS. 6A-6C, as will be explained in further detail in the context of FIGS. 8A-8C below.

Figure 8A:
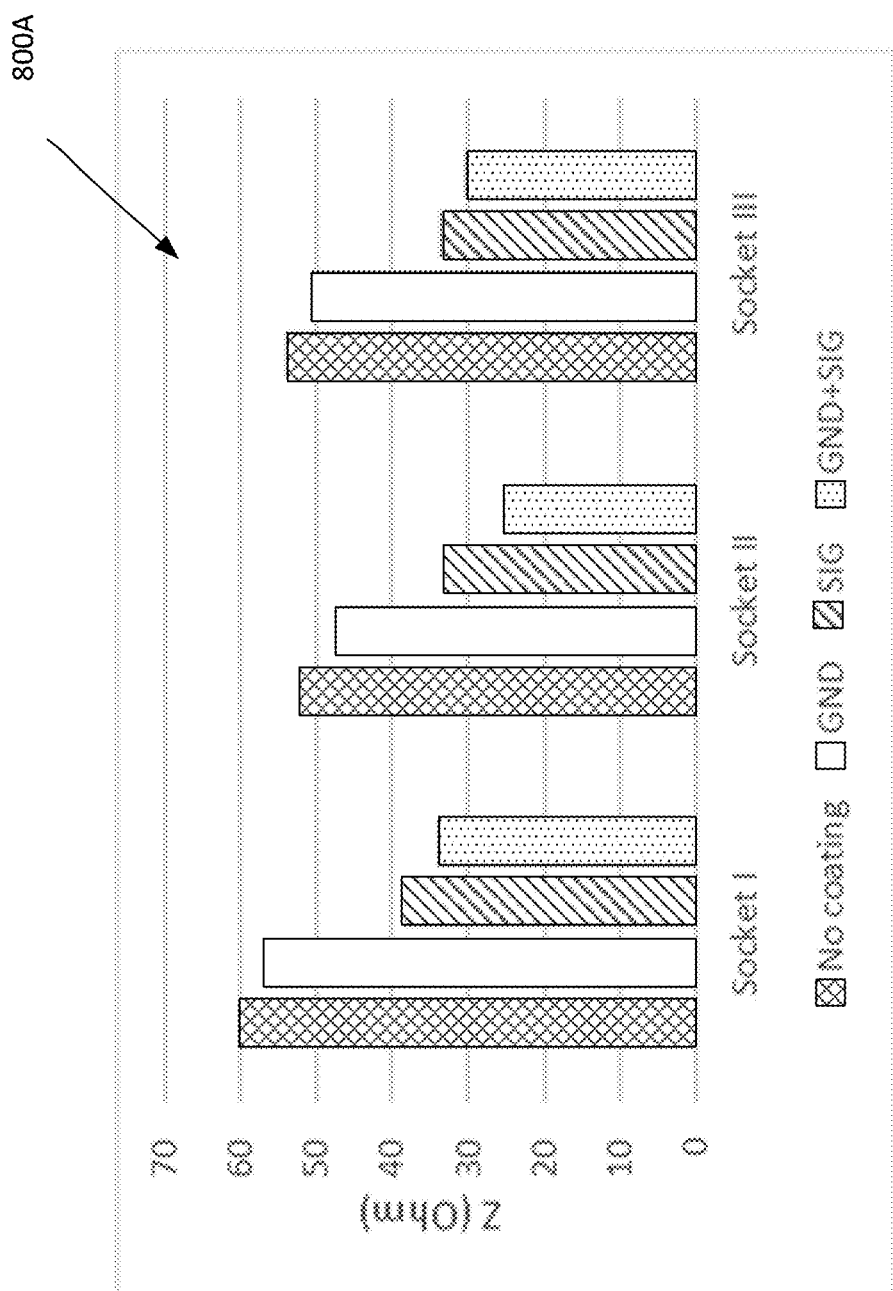
FIGS. 8A, 8B, and 8C pertain, respectively, to three bar graphs generated from simulation data based on three typical socket structures if each were to be configured to include no interconnection structure, and interconnection structures according to some embodiments.
Figure 8B:
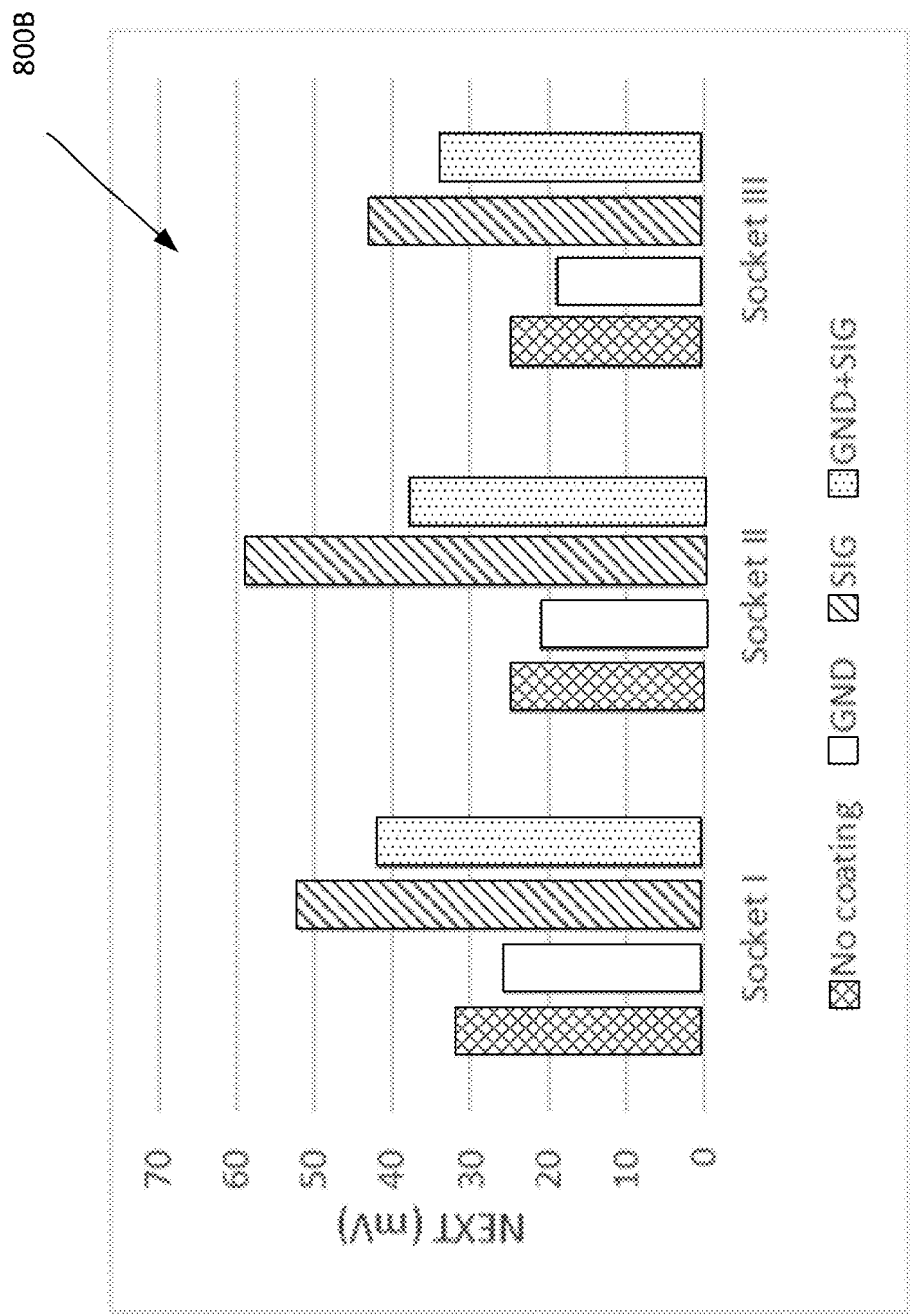
Figure 8C:
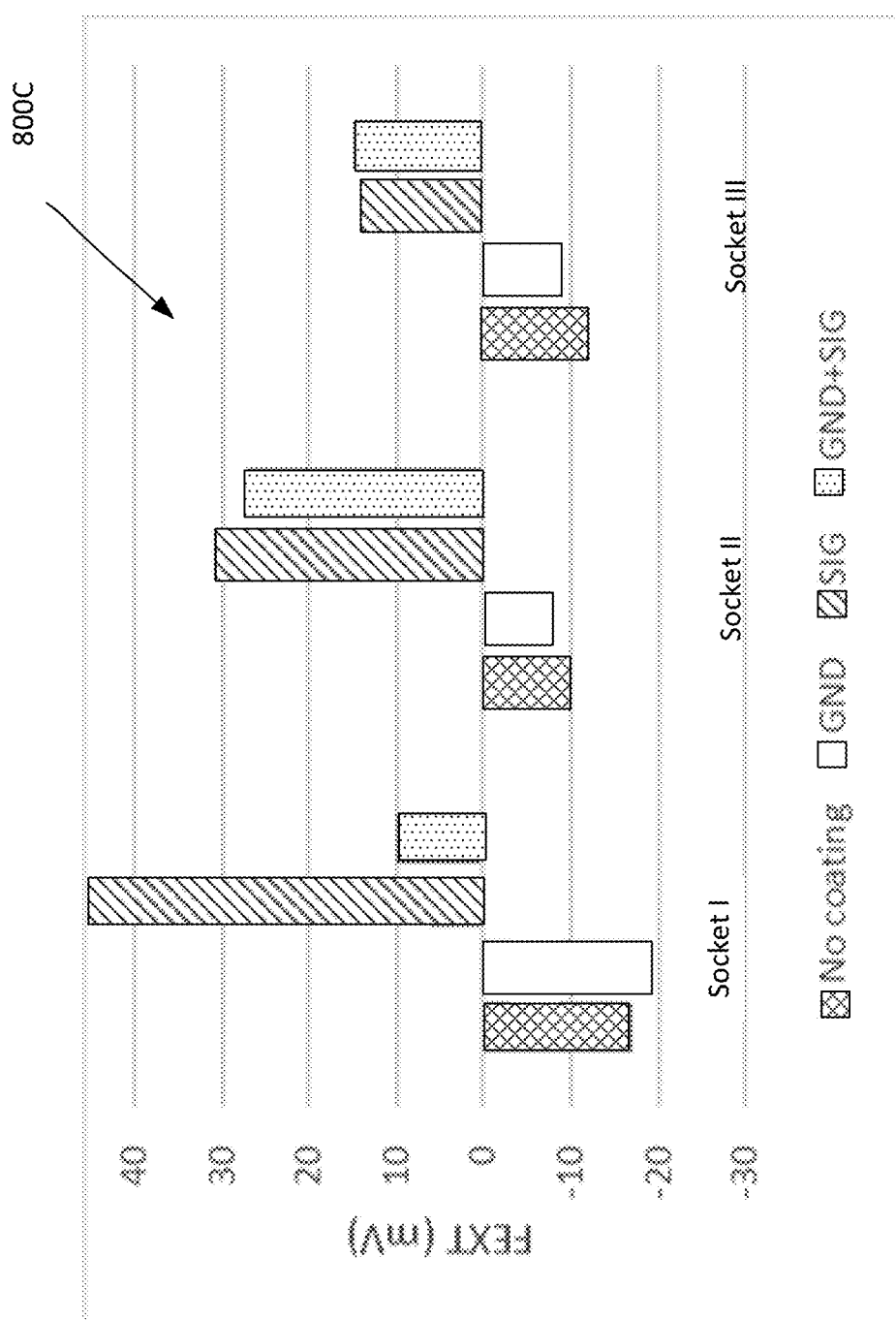

FIGS. 8A, 8B, and 8C pertain, respectively, to three bar graphs 800A, 800B, 800C, generated from simulation data based on three typical socket structures I, II and III if each were to be configured to include the following: (i) no conductive coating (as a reference) to form an interconnection structure according to embodiments, (ii) a conductive coating on the interior walls of the cavity of the socket structure housing for the ground pin only (for example similar to the embodiment of FIG. 7A), (iii) a conductive coating on the interior walls of the cavity of the socket structure housing for the signal pin only (for example similar to the embodiment of FIG. 7B), and (iv) a conductive coating on the interior walls of the cavity of the socket structure housing for the ground pin and the signal pin (for example similar to the embodiment of FIG. 7C).

Bar graph 800A plots single-ended (SE) impedance Z in Ohms versus socket type for socket configurations I, II and III in each of scenarios (i)-(iv) described above. Bar graph 800B plots NEXT in mV versus socket type for socket configurations I, II and III in each of scenarios (i)-(iv) described above. Bar graph 800C plots FEXT in mV versus socket type for socket configurations I, II and III in each of scenarios (i)-(iv) described above.

Time domain results as shown in FIGS. 8A-8C, including the SE impedance at graph 800A, NEXT at graph 800B, and FEXT at graph 800C, which demonstrate the benefits of the usage of interconnection structures including a conductive coating according to some embodiments. As shown in FIG. 8A, the SE impedance of a socket structure can decrease by up to 26 Ohms with the coating features. As suggested by FIG. 8A, an interconnection structure such as one including a conductive coating can tune the impedance by enhancing the signal to ground coupling without complicating contact geometry creating mechanical challenges.

As seen in FIG. 8B, NEXT decreases by up to 6 mV with ground pin coating, indicating that an enhanced signal to ground coupling by the ground pin cavity coating can effectively reduce NEXT.

As seem in FIG. 8C, FEXT shows a polarity change when a conductive coated body is used as the conductive structure of an interconnection structure according to some embodiments. In particular, a conductive coated body on interior walls of a cavity for a signal pin defined in the housing of a socket structure can change the pin-to-pin mutual capacitance, and may therefore be promising in cancelling the inductive coupling with the proper cavity geometry design and with the proper selection of the coating areas for the interior walls of the cavity meant for the signal pin. Changing the pin-to-pin mutual capacitance and cancelling inductive coupling between pins have been unavailable design knobs in current socket design optimization processes for FEXT control. Some embodiments advantageously make the above possible. Some embodiments may be regarded as providing an alternative to the on-package capacitive crosstalk cancelation concept (coupled via) in current package designs. Flexibilities of embodiments can help reduce the routings in a package and allow continuing scaling of the contacts on a printed circuit board (PCB), such as LGA land pad size reduction scaling.

FIGS. 9A-9C (collectively, "FIG. 9"), 10A-10C (collectively, "FIG. 10") and 11A-11C (collectively, "FIG. 11") show some implementations of a conductive structure according to some embodiments.

FIGS. 9-11 show three respective stages for the formation of a socket structure including interconnection structures including ground pins according to one embodiment.

FIG. 9 pertains to an embodiment of an interconnection structure where the conductive structure includes a conductive coating or a conductive coated body on interior walls of ground pin cavities of a socket structure housing.

In FIG. 9, a process begins with the provision at FIG. 9A of a socket structure 904 having a housing 905, such as a molded housing, a portion of which is shown in FIG. 9. Housing 905 defines therein cavities 913a for signal pins, and cavities 913b for ground pins. Ground pin cavities 913b are shown as defining a configuration that includes cavity extensions 915b in the direction of signal pin cavities adjacent thereto. In the shown embodiments of FIG. 9, each ground pin cavity includes one cavity extension for every signal pin adjacent thereto, although embodiments are not so limited.

In FIG. 9, the process continues with coating at FIG. 9B of the interior walls of the ground pin cavities 913b with a conductive material such as a metal. Coating may be performed using a spraying or printing process, by way of example only. The coating process results in a conductive structure 912b in the form of a conductive coating/conductive coated body on interior walls of the ground pin cavity 913b, the conductive coated body including coating extensions 917b on interior walls of the cavity extensions as shown that extend in the direction of signal pin cavities adjacent to respective ones of the cavity extensions. The conductive coated body in FIG. 9B, although suggested in FIG. 9B as potentially covering an entirety of inner surfaces of the ground pin cavities, may be provided only on portions of such inner surfaces. Thus, where "coating" or "coated body" is referred to here in the singular when referring to a coating within a cavity, it is to be understood that "coating" or "coated body" may refer to one or more distinct coating structures within a cavity resulting from a coating process.

In FIG. 9, the process continues with insertion in FIG. 9C of ground (G) and socket (S) pins 910b and 910a into their respective cavities 913b and 913a. Where a conductive coating is provided (i.e. in the ground pin cavities), the ground pins 910b are in electrical contact with their respective conductive coatings/conductive coated bodies, forming therewith interconnections structures according to some embodiments.

In the embodiment of FIG. 9, the conductive structure 912b includes the conductive coating shown. An effect of a conductive coating on impedance Z, NEXT and FEXT (refer to FIGS. 8A-8C) may for example be tailored by controlling a number of structural features of the interconnection structures, such as a thickness of the coating, a material of the coating, a placement of the coating on interior side walls of ground pin cavities, and a geometry of the cavity extensions.

FIG. 10 pertains to an embodiment of an interconnection structure where the conductive structure includes an insertable conductive structure insertable into the cavity of the socket structure housing. In the shown embodiment of FIG. 10, the insertable conductive structure includes insertable conductive stubs that are physically distinct from the signal and ground pins In FIG. 10, a process begins with the provision at FIG. 10A of a socket structure 1004 housing 1005, such as a molded housing, a portion of which is shown in FIG. 10. Housing 1005 defines therein cavities 1013a for signal pins, and cavities 1013b for ground pins. Ground pin cavities 1013b are shown as defining a configuration that includes cavity extensions 1015b in the direction of signal pin cavities adjacent thereto. In the shown embodiments of FIG. 10, each ground pin cavity includes one cavity extension for every signal pin adjacent thereto, although embodiments are not so limited.

In FIG. 10, the process continues with insertion in FIG. 10B of socket (S) pins 1010a and ground pins (g) 1010b into their respective cavities 1013a and 1013b.

In FIG. 10, the process continues with insertion in FIG. 10C of conductive stubs 1017b into each of the ground pin cavities 1013b. Where insertable conductive stubs are provided, the ground pins 1010b are in electrical contact with their respective conductive stubs, forming therewith interconnection structures according to some embodiments. In the embodiment of FIG. 10, the stubs 1017b may include generally flat elongated bodies as shown, although embodiments are not so limited.

In the embodiment of FIG. 10, the conductive structure 1012b includes respective conductive stubs 1017b. An effect of conductive stubs on impedance Z, NEXT and FEXT (refer for example to FIGS. 8A-8C) may for example be tailored by controlling a number of structural features of the interconnection structures, such as a thickness of the stubs, a material of the stubs, a placement of the stubs within the ground pin cavities, a geometry of the stubs, and a geometry of the cavity extensions.

FIG. 11 pertains to an embodiment of an interconnection structure where the conductive structure includes an insertable conductive structure insertable into the cavity of the socket structure housing. In the shown embodiment of FIG. 11, the insertable conductive structure includes a stubby feature that is unitary with the contact element (fixed to the context element, or forming a one-piece body with the contact element). In the case of FIG. 11, the inserted together with the contact element as a unitary interconnection structure into the housing cavity of the socket structure In FIG. 11, a process begins with the provision at FIG. 11A of a socket structure 1104 housing 1105, such as a molded housing, a portion of which is shown in FIG. 11. Housing 1105 defines therein cavities 1113a for signal pins, and cavities 1113b for ground pins. Ground pin cavities 1113b are shown as defining a configuration that includes cavity extensions 1115b in the direction of signal pin cavities adjacent thereto. In the shown embodiments of FIG. 11, each ground pin cavity includes one cavity extension for every signal pin adjacent thereto, although embodiments are not so limited.

In FIG. 11, the process continues with insertion, in FIG. 11B, into ground pin cavities 1113b of interconnection structures 1108b which include ground pins portions (g) 1110b and stub portions 1117b, where the ground pin portions are unitary with their corresponding stub portion. For each ground pin 1110b, a stub portion 1117b as shown includes three stub extensions 1119b that extend into corresponding cavity extensions 1115b.

In the embodiment of FIG. 11, the conductive structure 1112b includes stub portions 1117b of interconnection structure 1108b which also include ground pin 1110b. An effect of unitary insertable structures on impedance Z, NEXT and FEXT (refer for example to FIGS. 8A-8C) may for example be tailored by controlling a number of structural features of the interconnection structures, such as a thickness of the stub extensions, a material of the stub portion, a geometry of the stub portion, and a geometry of the cavity extensions.

FIG. 11 was described in the context of unitary interconnection structure, that may be interpreted as corresponding to: (1) an interconnection structure that includes a ground pin portion and a corresponding stub portion together forming a one-piece interconnection structure before the interconnection structure is inserted into the socket structure housing cavity, (2) an interconnection structure that includes a ground pin portion and a corresponding stub portion fixed together/secured together before the interconnection structure is inserted into the socket structure housing cavity, or (2) an interconnection structure that includes a stub defining a recess therein to receive the pin after the interconnection. The combination of the pin inserted into the recessed stub would form an interconnection structure according to an embodiment.

Figure 12B:
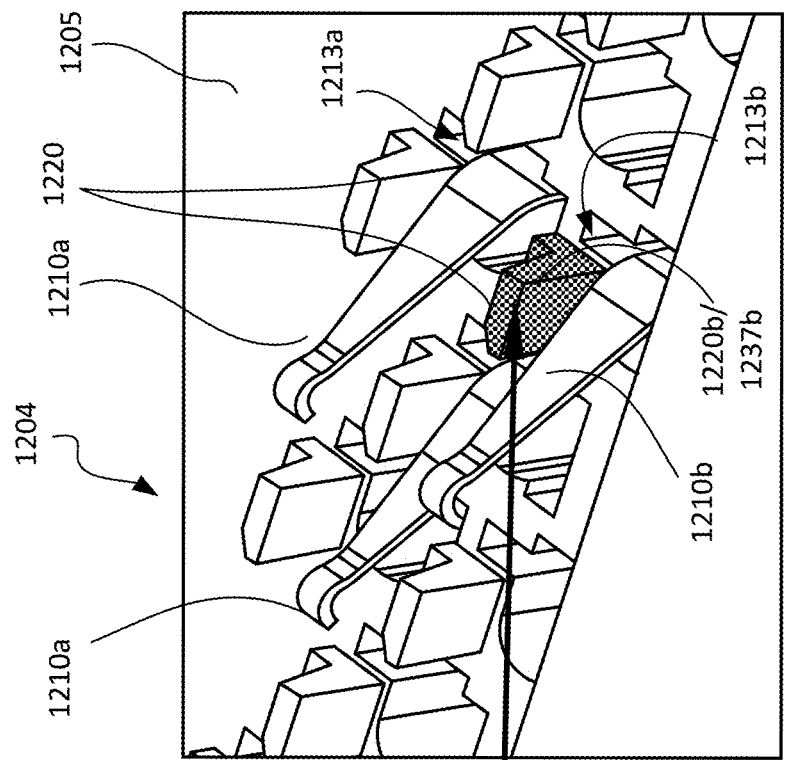
FIGS. 12A-12B illustrate respective perspective views of a socket structure portion without and with the provision of an interconnection structure extending on a top surface of socket structure housing according to one embodiment.
Figure 12A:
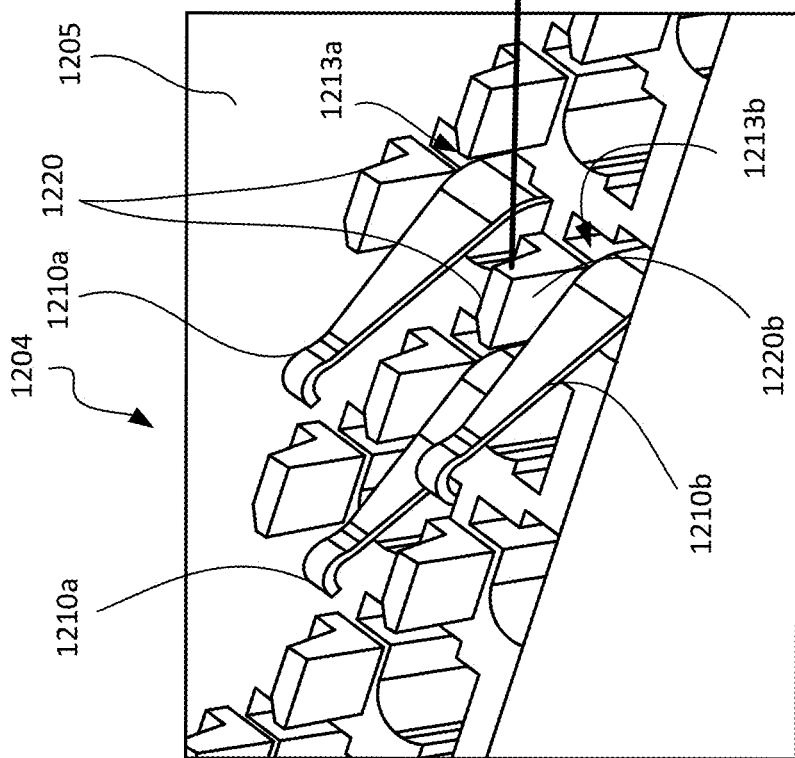

Reference is now made to FIGS. 12A and 12B (collectively, "FIG. 12") which show perspective views of a socket structure portion without (FIG. 12A) and with the provision of an interconnection structure where the conductive structure extends beyond the cavity of the socket structure housing (FIG. 12B) and onto a surface of the socket structure housing to face a surface of an electronic package to be coupled to the pins (top surface of the socket structure).

Advantageously, providing a conductive structure which includes, in addition or instead of a conductive structure inside the socket structure housing cavity, at least a portion or an entirety of a conductive structure that is disposed on a surface of the socket structure housing configured to face a surface of an electronic package to be coupled to the pins within the cavity.

FIG. 12A shows a portion 1200A of a socket structure 1204 including a housing 1205 defining cavities 1213a and 1213b therein for signal pins 1210a and for ground pins 1210b, respectively. Socket structure 1204 further includes mechanically interacting interfaces, in the shown embodiment in the form of interstitial seating planes (ISPs) 1220 on a surface of housing 1205 that is to face a surface of an electronic package to be coupled to the socket via the pins (hereinafter a "top" surface of the housing—in general, "bottom" and "top" as used herein refer to bottom and top as seen within the orientation of FIG. 1)

According to some embodiments, as shown in FIG. 12B, one or more ISPs 1220 may be include conductive bodies 1237b to make the one or more ISPs part of an interconnection structure according to some embodiments. An ISP serves a mechanical purpose, namely, that of serving as a rigid support for an electronic package to be coupled to another package, such as a motherboard, through the pins. The ISP provides protection from over-deflection and shorting of the contacts in high load conditions. However, an ISP including a conductive body 1237b thereon allows it to serve a dual purpose, that is, a mechanical support purpose, and an electrical coupling purpose. The electrical coupling purpose may for example include a reduction in impedance and crosstalk between pins as suggested in the graphs of FIGS. 8A-8C above.

According to an embodiment, conductive body 1237b may include a conductive coating provided on the ISP. The conductive coating can be plated on the mechanically interacting interface (e.g. ISP), and the coating may optionally happen with the provision of additional LGA pads depending on if an additional connection to the LGA pad is desired.

According to another embodiment, conductive body 1237b may be part of an insertable ISP that is to be inserted into a core hole of the socket structure housing 1205. In the case of an inserted ISP, the core hole for the ISP may not be a through hole through the housing 1205, but rather a blind hole which can be used to contain the feature of the ISP including a conductive structure, and provide enough rigidity to provide both electrical and mechanical benefit. The ISP may be configured to touch the bottom side ("bottom" and "top" as used herein refer to bottom and top as seen within the orientation of FIG. 1) of the package in the fully deflected condition (that is, when the package is in place and the pins are fully deflected and contacting the bottom side of the same). Where an embodiment of a beam is used as will be explained in further detail in the context of FIG. 13, the ISP of FIG. 12 may be positioned in the same plane as the plane of the deflected beam, meaning that the entirety of the beam section will be in plane with the ISP under fully deflected condition, as will be explained further in relation to FIG. 13.

Conductive Tuning Features in Depopulated Regions of Socket Structure

FIGS. 13A, 13B and 13C (collectively, "FIG. 13") show a portion 1300 of a socket structure 1304 including a socket structure housing 1305 defining cavities 1313, pins 1310 (either ground or signal) being inserted into the cavities 1313. The cavities and/or top surface of the socket structure housing include free locations 1311, that is, locations where pins are usually not able to be placed during manufacturing. One free location 1311 is shown in broken lines in FIGS.

14A and 14B. According to FIG. 13, tuning features, such as tuning pieces, may be provided at the free location 1311 as will be explained below.

FIG. 13A shows a portion of a top surface socket structure housing 105 including a split region or free location 1311 between two rows of pins. The split region or free location is required, for geometrical and mechanical reasons, to prevent both overlap of the pins and to provide symmetry in the frictional force of the pins on the package. The free location 1311 may, according to some embodiments, be utilized to stitch additional conductive tuning features 1321 (FIG. 13C).

According to some embodiments, one or more conductive tuning features 1321 may be placed on the free locations 1311. The conductive tuning features 1321 may include straight pieces and/or more complex pieces, and can be plated onto the free locations, and/or can include separate pieces mechanically in-contact with one another through an interference fit. In the shown embodiment of FIG. 13C, for example, the conductive tuning features are shown to include modular tuning pieces 1327 inserted into corresponding holes 1323 in the socket structure housing, and, in addition, a tuning beam 1325, stitched between the modular tuning pieces and in electrical contact therewith, the tuning beam 1325 mechanically in contact with the modular tuning pieces 1327 through an interference fit. A schematic depiction of the tuning beam 1325 providing an electrical connection is shown in FIG. 13. According to some embodiments, the tuning beam 1325 may be similar to the vertical beam of a typical contact pin. This latter version may require gold plating, depending on the use case of the part due to the tuning beam connection. This may help with modularly controlling the dimensions of the structure in certain areas by combining them when necessary. Accordingly, one can combine the individual features using a horizontally positioned metal piece such as tuning beam 1325, such as a stitchable insert which can be easily tuned (removed/added) to connect with other tuning features. The tuning beam 1325 may function like a connector and therefore may need to be gold coated.

Referring to FIG. 13A, process of providing conductive tuning features 1321 according to some embodiments may include first providing a socket structure housing that defines holes 1329 therein, the holes at free locations of a top surface of the socket structure housing.

Referring to FIG. 13B, an intermediate process of providing conductive tuning features 1321 according to some embodiments may include inserting modular tuning pieces 1327 into the holes 1329.

Referring to FIG. 13C, the process of providing the conductive tuning features 1321 may further include inserting a tuning beam 1325 between pairs of the modular tuning pieces 1327 such that the tuning beam 1325 is mechanically in contact with the modular tuning pieces 1327 through an interference fit, and electrically coupled to the same.

The beam portion of a pin 1310 takes up considerable space. Tuning features 1321 can be stitched separately onto the free locations of the top surface of the socket structure housing prior to actual pin stitching (not shown), or after actual pin stitching, or at the same time as actual pin stitching, and can advantageously provide electrical benefit to the socket structure in previously unused locations thereof. For example, such electrical benefit may be similar to electrical benefits already outlined above with respect to the provision of an interconnection structure in the context of FIGS. 1-12. The embodiment of a conductive tuning feature, an example of which has been described in the context of FIG. 13, may for example be used together with the provision of interconnection structures according to embodiments as described herein in order to optimize an electrical tuning of a socket structure, and help mitigate impedance and crosstalk in the same.

Figure 14:
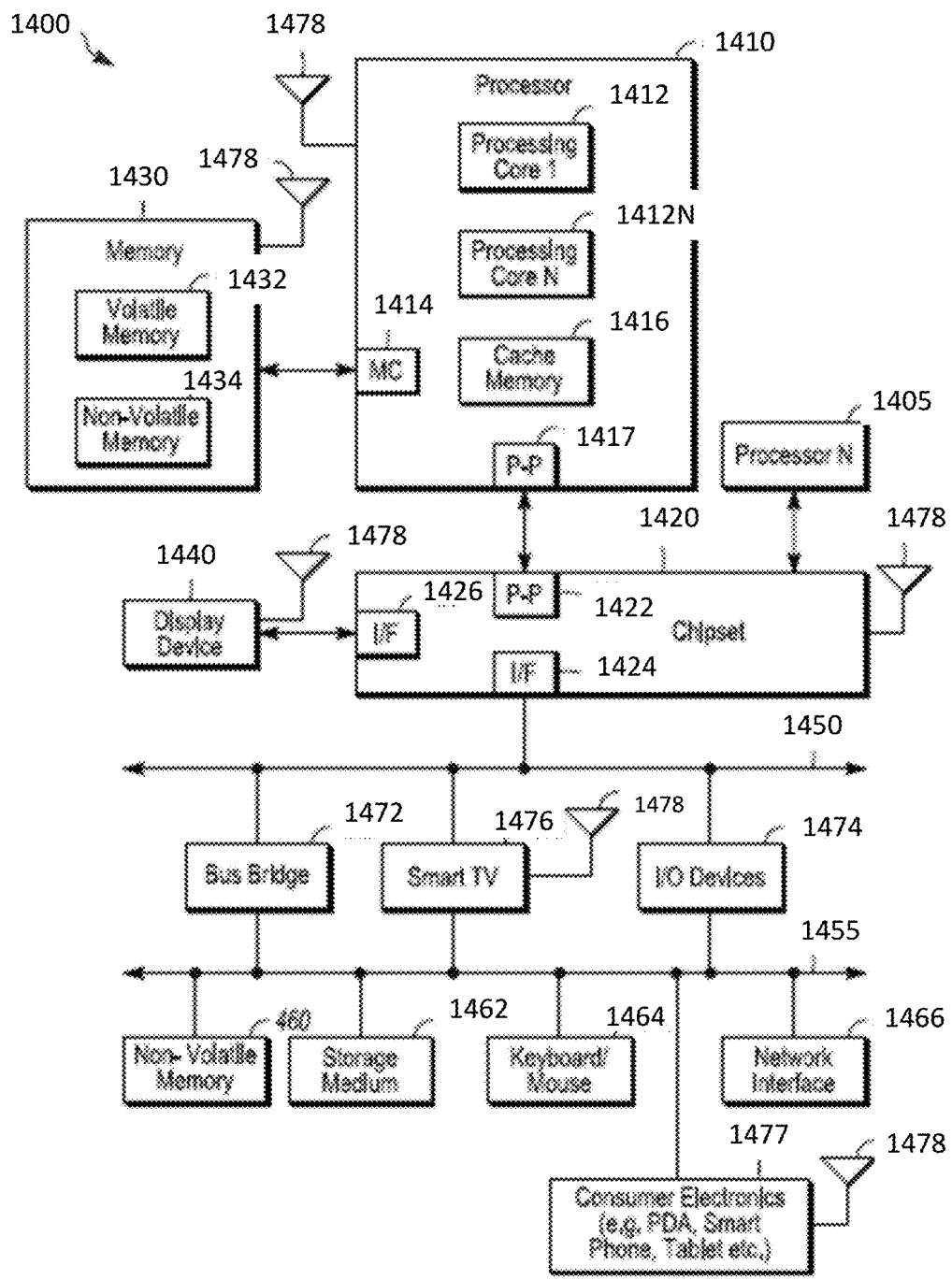
FIG. 14 illustrates a computing system including a socket structure according to embodiments.

FIG. 14 illustrates a system level diagram of a computing system using the methods described herein. In one embodiment, computing system 1400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, computing system 1400 is a system on a chip (SOC) system.

In one embodiment, processor 1410 has one or more processor cores 1412 and 1412N, where 1412N represents the Nth processor core inside processor 1410 where N is a positive integer. In one embodiment, computing system 1400 includes multiple processors including 1410 and 1405, where processor 1405 has logic similar or identical to the logic of processor 1410. In some embodiments, processing core 1412 includes, but is not limited to, pre-fetch logic to fetch instructions, decode logic to decode the instructions, execution logic to execute instructions and the like. In some embodiments, processor 1410 has a cache memory 1416 to cache instructions and/or data for computing system 1400. Cache memory 1416 may be organized into a hierarchal structure including one or more levels of cache memory.

In some embodiments, processor 1410 includes a memory controller 1414, which is operable to perform functions that enable the processor 1410 to access and communicate with memory 1430 that includes a volatile memory 1432 and/or a non-volatile memory 1434. In some embodiments, processor 1410 is coupled with memory 1430 and chipset 1420. Processor 1410 may also be coupled to a wireless antenna 1478 to communicate with any device configured to transmit and/or receive wireless signals. In one embodiment, an interface for wireless antenna 1478 operates in accordance with the 4GPP and/or IEEE 1402.11 standard protocol, Home Plug AV (HPAV), Ultra Wide Band (UWB), Bluetooth, WiMax, or any form of wireless communication protocol.

In some embodiments, volatile memory 1432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1434 includes, but is not limited to, flash memory, phase change memory (PCM), read-only memory (ROM), electrically erasable programmable read-only memory (EEPROM), or any other type of non-volatile memory device.

Memory 1430 stores information and instructions to be executed by processor 1410. In one embodiment, memory 1430 may also store temporary variables or other intermediate information while processor 1410 is executing instructions. In the illustrated embodiment, chipset 1420 connects with processor 1410 via Point-to-Point (PtP or P-P) interfaces 1417 and 1422. Chipset 1420 enables processor 1410 to connect to other elements in computing system 1400. In some embodiments of the example system, interfaces 1417 and 1422 operate in accordance with a PtP communication protocol such as the Intel® QuickPath Interconnect (QPI) or the like. In other embodiments, a different interconnect may be used.

In some embodiments, chipset 1420 is operable to communicate with processor 1410, 1405N, display device 1440, and other devices, including a bus bridge 1472, a smart TV 1476, I/O devices 1474, nonvolatile memory 1460, a storage medium (such as one or more mass storage devices) 1462, a keyboard/mouse 1464, a network interface 1466, and various forms of consumer electronics 1477 (such as a PDA, smart phone, tablet etc.), etc. In one embodiment, chipset 1420 couples with these devices through an interface 1424. Chipset 1420 may also be coupled to a wireless antenna 1478 to communicate with any device configured to transmit and/or receive wireless signals.

Chipset 1420 connects to display device 1440 via interface 1426. Display 1440 may be, for example, a liquid crystal display (LCD), a light emitting diode (LED) array, an organic light emitting diode (OLED) array, or any other form of visual display device. In some embodiments of the example system, processor 1410 and chipset 1420 are merged into a single SOC. In addition, chipset 1420 connects to one or more buses 1450 and 1455 that interconnect various system elements, such as I/O devices 1474, nonvolatile memory 1460, storage medium 1462, a keyboard/mouse 1464, and network interface 1466. Buses 1450 and 1455 may be interconnected together via a bus bridge 1472.

In one embodiment, mass storage device 1462 includes, but is not limited to, a solid state drive, a hard disk drive, a universal serial bus flash memory drive, or any other form of computer data storage medium. In one embodiment, network interface 1466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 4GPP standard and its related family, the IEEE 802.11 standard and its related family, Home Plug AV (HPAV), Ultra Wide Band (UWB), Bluetooth, WiMax, or any form of wireless communication protocol.

While the modules shown in FIG. 14 are depicted as separate blocks within the computing system 1400, the functions performed by some of these blocks may be integrated within a single semiconductor circuit or may be implemented using two or more separate integrated circuits. For example, although cache memory 1416 is depicted as a separate block within processor 1410, cache memory 1416 (or selected aspects of 1416) can be incorporated into processor core 1412.

FIG. 16 is a flow chart of a process 1500 according to some embodiments. At operation 1502, providing a cavity in a socket housing made of a dielectric material; at operation 1504, providing an interconnection structure including: a contact element disposed at least in part within the cavity, and configured to be electrically coupled to a corresponding microelectronic package, the contact element corresponding to one of a signal contact element or a ground contact element; and a conductive structure disposed at least in part within the cavity, electrically coupled to the contact element, and having an outer contour that is non-conformal with respect to an outer contour of the contact element.

EXAMPLES

Some non-limiting example embodiments are set forth below.

Example 1 includes a microelectronic socket structure comprising: a socket structure housing defining a cavity therein; and an interconnection structure including: a contact element disposed at least in part within the cavity, and configured to be electrically coupled to a corresponding microelectronic package, the contact element corresponding to one of a signal contact element or a ground contact element; and a conductive structure disposed at least in part within the cavity, electrically coupled to the contact element, and having an outer contour that is non-conformal with respect to an outer contour of the contact element.

Example 2 includes the subject matter of Example 1, wherein the conductive structure includes a conductive coating on interior walls of the cavity, the conductive coating disposed on at least a portion of the interior walls.

Example 3 includes the subject matter of Example 1, wherein the conductive structure includes an insertable conductive structure inserted into the cavity of the socket structure housing.

Example 4 includes the subject matter of Example 3, wherein the insertable conductive structure includes one or more conductive stubs.

Example 5 includes the subject matter of Example 3, wherein the interconnection structure is a unitary interconnection structure, and the insertable conductive structure includes the contact element and a stubby feature fixed to the contact element to form the unitary interconnection structure therewith.

Example 6 includes the subject matter of Example 3, wherein the insertable conductive structure includes a conductive body defining a recess therein, the contact element inserted within the recess.

Example 7 includes the subject matter of Example 1, wherein the contact element and the conductive structure are made of a conductive material including at least one of copper, aluminum, gold, silver, nickel, palladium, tungsten, brass, bronze, iron, platinum, steel, lead or stainless steel.

Example 8 includes the subject matter of any one of Examples 1-7, wherein the socket structure includes one of a land grid array (LGA) socket structure, a low insertion force(LIF) socket structure, or a pin grid array (PGA) socket structure.

Example 9 includes the subject matter of any one of Examples 1-8, wherein the socket structure includes a dielectric material.

Example 10 includes the subject matter of Example 8, wherein the contact element is a pin.

Example 11 includes the subject matter of Example 8, wherein the contact element includes a coating thereon.

Example 12 includes the subject matter of any one of Examples 1-11, wherein the contact element is a ground contact element.

Example 13 includes the subject matter of Example 12, wherein the cavity includes one or more cavity extensions extending in a direction toward one or more respective adjacent signal contact elements of the socket structure, the conductive structure disposed at least in part within the one or more cavity extensions.

Example 14 includes the subject matter of Example 13, wherein the one or more cavity extensions include individual extensions respectively extending in a direction of a respective one of the adjacent signal contact elements.

Example 15 includes the subject matter of Example 1, wherein the conductive structure includes a portion that extends beyond the cavity of the socket structure housing and onto a top surface of the socket structure housing, the top surface to face a surface of the package when the contact element is electrically coupled to the package.

Example 16 includes the subject matter of Example 15, wherein the socket structure housing includes an interstitial seating plane on the top surface thereof, and the portion of the conductive structure includes a conductive body on the interstitial seating plane (ISP).

Example 17 includes the subject matter of Example 16, wherein the conductive body includes a conductive coating on a surface of the ISP.

Example 18 includes the subject matter of Example 16, wherein the socket structure housing defines a blind hole therein, the ISP includes a portion extending into the blind hole.

Example 19 includes the subject matter of any one of Examples 1-16, further including a split region, and conductive tuning features disposed on the split regions.

Example 20 includes the subject matter of Example 19, wherein the socket structure housing defines tuning feature holes, and the conductive tuning features are inserted into the holes.

Example 21 includes the subject matter of Example 20, further including a tuning beam stitched between the tuning features and in electrical contact therewith and mechanically contacting the tuning features through an interference fit.

Example 22 includes a microelectronic system comprising: a microelectronic package containing package circuitry, and package contacts configured to provide signals and ground to the package circuitry; a motherboard containing motherboard circuitry and motherboard contacts configured to provide signals and ground between the motherboard circuitry and the package circuitry; and a microelectronic socket structure between the package and the motherboard and including: a socket structure housing defining a plurality of cavities therein; and a plurality of interconnection structures, individual ones of the interconnection structures including: a contact element disposed at least in part within a corresponding one of the cavities, and electrically coupled to a corresponding one of the package contacts and the motherboard contacts, the contact element further including one of a signal contact element or a ground contact element; and a conductive structure disposed at least in part within a corresponding one of the cavities, electrically coupled to the contact element, and having an outer contour that is non-conformal with respect to an outer contour of the contact element.

Example 23 includes the subject matter of Example 22, wherein the conductive structure includes a conductive coating on interior walls of the corresponding one of the cavities, the conductive coating disposed on at least a portion of the interior walls.

Example 24 includes the subject matter of Example 22, wherein the conductive structure includes an insertable conductive structure inserted into the corresponding one of the cavities of the socket structure housing.

Example 25 includes the subject matter of Example 24, wherein the insertable conductive structure includes one or more conductive stubs.

Example 26 includes the subject matter of Example 24, wherein the interconnection structure is a unitary interconnection structure, and the insertable conductive structure includes the contact element and a stubby feature fixed to the contact element to form the unitary interconnection structure therewith.

Example 27 includes the subject matter of Example 24, wherein the insertable conductive structure includes a conductive body defining a recess therein, the contact element inserted within the recess.

Example 28 includes the subject matter of Example 24, wherein the contact element and the conductive structure are made of a conductive material including at least one of copper, aluminum, gold, silver, nickel, palladium, tungsten, brass, bronze, iron, platinum, steel, lead or stainless steel.

Example 29 includes the subject matter of any one of Examples 22-28, wherein the socket structure includes one of a land grid array (LGA) socket structure, a low insertion force (LIF) socket structure, or a pin grid array (PGA) socket structure.

Example 30 includes the subject matter of any one of Examples 22-29, wherein the socket structure includes a dielectric material.

Example 31 includes the subject matter of Example 29, wherein the contact element is a pin.

Example 32 includes the subject matter of Example 29, wherein the contact element includes a coating thereon.

Example 33 includes the subject matter of any one of Examples 22-32, wherein the contact element is a ground contact element.

Example 34 includes the subject matter of Example 33, wherein the corresponding one of the cavities includes one or more cavity extensions extending in a direction toward one or more respective adjacent signal contact elements of the socket structure, the conductive structure disposed at least in part within the one or more cavity extensions.

Example 35 includes the subject matter of Example 34, wherein the one or more cavity extensions include individual extensions respectively extending in a direction of a respective one of the adjacent signal contact elements.

Example 36 includes the subject matter of Example 22, wherein the conductive structure includes a portion that extends beyond the corresponding one of the cavities of the socket structure housing and onto a top surface of the socket structure housing, the top surface to face a surface of the package when the contact element is electrically coupled to the package.

Example 37 includes the subject matter of Example 36, wherein the socket structure housing includes an interstitial seating plane on the top surface thereof, and the portion of the conductive structure includes a conductive body on the interstitial seating plane (ISP).

Example 38 includes the subject matter of Example 37, wherein the conductive body includes a conductive coating on a surface of the ISP.

Example 39 includes the subject matter of Example 37, wherein the socket structure housing defines a blind hole therein, the ISP includes a portion extending into the blind hole.

Example 40 includes the subject matter of any one of Examples 22-37, further including a split region, and conductive tuning features disposed on the split regions.

Example 41 includes the subject matter of Example 40, wherein the socket structure housing defines tuning feature holes, and the conductive tuning features are inserted into the holes.

Example 42 includes the subject matter of Example 41, further including a tuning beam stitched between the tuning features and in electrical contact therewith and mechanically contacting the tuning features through an interference fit.

Example 43 includes a computing system including: a memory; and a processors coupled to the memory and including an microelectronic system that comprises: a microelectronic package containing package circuitry, and package contacts configured to provide signals and ground to the package circuitry; a motherboard containing motherboard circuitry and motherboard contacts configured to provide signals and ground between the motherboard circuitry and the package circuitry; and a microelectronic socket structure between the package and the motherboard and including: a socket structure housing defining a plurality of cavities therein; and a plurality of interconnection structures, individual ones of the interconnection structures including: a contact element disposed at least in part within a corresponding one of the cavities, and electrically coupled to a corresponding one of the package contacts and the motherboard contacts, the contact element further including one of a signal contact element or a ground contact element; and a conductive structure disposed at least in part within a corresponding one of the cavities, electrically coupled to the contact element, and having an outer contour that is non-conformal with respect to an outer contour of the contact element.

Example 44 includes the subject matter of Example 43, wherein the conductive structure includes a conductive coating on interior walls of the corresponding one of the cavities, the conductive coating disposed on at least a portion of the interior walls.

Example 45 includes the subject matter of Example 43, wherein the conductive structure includes an insertable conductive structure inserted into the corresponding one of the cavities of the socket structure housing.

Example 46 includes the subject matter of Example 49, wherein the insertable conductive structure includes one or more conductive stubs.

Example 47 includes the subject matter of Example 49, wherein the interconnection structure is a unitary interconnection structure, and the insertable conductive structure includes the contact element and a stubby feature fixed to the contact element to form the unitary interconnection structure therewith.

Example 48 includes the subject matter of Example 49, wherein the insertable conductive structure includes a conductive body defining a recess therein, the contact element inserted within the recess.

Example 49 includes the subject matter of Example 49, wherein the contact element and the conductive structure are made of a conductive material including at least one of copper, aluminum, gold, silver, nickel, palladium, tungsten, brass, bronze, iron, platinum, steel, lead or stainless steel.

Example 50 includes the subject matter of any one of Examples 47-53, wherein the socket structure includes one of a land grid array (LGA) socket structure, a low insertion force(LIF) socket structure, or a pin grid array (PGA) socket structure.

Example 51 includes the subject matter of any one of Examples 47-54, wherein the socket structure includes a dielectric material.

Example 52 includes the subject matter of Example 54, wherein the contact element is a pin.

Example 53 includes the subject matter of Example 54, wherein the contact element includes a coating thereon.

Example 54 includes the subject matter of any one of Examples 47-57, wherein the contact element is a ground contact element.

Example 55 includes the subject matter of Example 58, wherein the corresponding one of the cavities includes one or more cavity extensions extending in a direction toward one or more respective adjacent signal contact elements of the socket structure, the conductive structure disposed at least in part within the one or more cavity extensions.

Example 56 includes the subject matter of Example 59, wherein the one or more cavity extensions include individual extensions respectively extending in a direction of a respective one of the adjacent signal contact elements.

Example 57 includes the subject matter of Example 47, wherein the conductive structure includes a portion that extends beyond the corresponding one of the cavities of the socket structure housing and onto a top surface of the socket structure housing, the top surface to face a surface of the package when the contact element is electrically coupled to the package.

Example 58 includes the subject matter of Example 61, wherein the socket structure housing includes an interstitial seating plane on the top surface thereof, and the portion of the conductive structure includes a conductive body on the interstitial seating plane (ISP).

Example 59 includes the subject matter of Example 62, wherein the conductive body includes a conductive coating on a surface of the ISP.

Example 60 includes the subject matter of Example 62, wherein the socket structure housing defines a blind hole therein, the ISP includes a portion extending into the blind hole.

Example 61 includes the subject matter of any one of Examples 47-62, further including a split region, and conductive tuning features disposed on the split regions.

Example 62 includes the subject matter of Example 65, wherein the socket structure housing defines tuning feature holes, and the conductive tuning features are inserted into the holes.

Example 63 includes the subject matter of Example 66, further including a tuning beam stitched between the tuning features and in electrical contact therewith and mechanically contacting the tuning features through an interference fit.

Example 64 includes a method of fabricating a socket structure for a microelectronic system, the method including: providing a cavity in a socket housing made of a dielectric material; providing an interconnection structure including: a contact element disposed at least in part within the cavity, and configured to be electrically coupled to a corresponding microelectronic package, the contact element corresponding to one of a signal contact element or a ground contact element; and a conductive structure disposed at least in part within the cavity, electrically coupled to the contact element, and having an outer contour that is non-conformal with respect to an outer contour of the contact element.

Example 65 includes the subject matter of Example 64, wherein providing the interconnection structure includes providing the conductive structure by coating on interior walls of the cavity with a conductive coating.

Example 66 includes the subject matter of Example 64, wherein providing the interconnection structure includes forming an insertable conductive structure as the conductive structure, and inserting the insertable conductive structure into the cavity of the socket structure housing.

Example 67 includes the subject matter of Example 66, wherein the insertable conductive structure includes one or more conductive stubs.

Example 68 includes the subject matter of Example 66, wherein the interconnection structure is a unitary interconnection structure, the insertable conductive structure includes a stubby feature, and forming the interconnection structure further includes fixing the stubby feature to the contact element.

Example 69 includes the subject matter of Example 66, wherein the insertable conductive structure includes a conductive body defining a recess therein, and forming the interconnection structure includes inserting the contact element within the recess prior to or after insertion of the conductive body into the cavity.

Example 70 includes the subject matter of Example 64, wherein the contact element and the conductive structure are made of a conductive material including at least one of copper, aluminum, gold, silver, nickel, palladium, tungsten, brass, bronze, iron, platinum, steel, lead or stainless steel.

Example 71 includes the subject matter of any one of Examples 64-70, wherein the socket structure includes one of a land grid array (LGA) socket structure, a low insertion force(LIF) socket structure, or a pin grid array (PGA) socket structure.

Example 72 includes the subject matter of any one of Examples 64-71, wherein the socket structure includes a dielectric material.

Example 73 includes the subject matter of Example 71, wherein the contact element is a pin.

Example 74 includes the subject matter of Example 71, further including providing the contact element by using a metal stamping process.

Example 75 includes the subject matter of Example 71, further including coating the contact element with at least one of a gold or a nickel coating.

Example 76 includes the subject matter of any one of Examples 64-75, wherein the contact element is a ground contact element.

Example 77 includes the subject matter of Example 76, wherein the cavity includes one or more cavity extensions extending in a direction toward one or more respective adjacent signal contact elements of the socket structure, the conductive structure disposed at least in part within the one or more cavity extensions.

Example 78 includes the subject matter of Example 77, wherein the one or more cavity extensions include individual extensions respectively extending in a direction of a respective one of the adjacent signal contact elements.

Example 79 includes the subject matter of Example 64, wherein the conductive structure includes a portion that extends beyond the cavity of the socket structure housing and onto a top surface of the socket structure housing, the top surface to face a surface of the package when the contact element is electrically coupled to the package.

Example 80 includes the subject matter of Example 78, wherein the socket structure housing includes an interstitial seating plane on the top surface thereof, and the portion of the conductive structure includes a conductive body on the interstitial seating plane (ISP).

Example 81 includes the subject matter of Example 79, wherein the conductive body includes a conductive coating on a surface of the ISP.

Example 82 includes the subject matter of Example 79, wherein the socket structure housing defines a blind hole therein, the ISP includes a portion extending into the blind hole.

Example 83 includes the subject matter of any one of Examples 64-79, the socket structure housing further including a split region, the method including providing conductive tuning features on the split regions.

Example 84 includes the subject matter of Example 82, further including providing tuning feature holes in the socket structure housing, and inserting the conductive tuning features into the holes.

Example 85 includes the subject matter of Example 83, further including stitching a tuning beam between the tuning features to place it in electrical contact therewith and to establish a mechanical contacting therewith through an interference fit.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A microelectronic socket structure comprising:
   a socket structure housing defining a cavity therein; and
   an interconnection structure including:
      a contact element at least in part within the cavity, and to be electrically coupled to a corresponding microelectronic package, the contact element corresponding to one of a signal contact element or a ground contact element; and
      a conductive structure at least in part within the cavity and electrically coupled to the contact element at opposite sides of the contact element, the conductive structure having an inner contour that is non-conformal with respect to an outer contour of the contact element, the inner contour of the conductive structure facing the outer contour of the contact element.

2. The socket structure of claim 1, wherein the conductive structure includes a conductive coating on interior walls of the cavity, the conductive coating on at least a portion of the interior walls.

3. The socket structure of claim 1, wherein the conductive structure includes an insertable conductive structure inserted into the cavity of the socket structure housing.

4. The socket structure of claim 3, wherein the insertable conductive structure includes one or more conductive stubs.

5. The socket structure of claim 3, wherein the interconnection structure is a unitary interconnection structure, and the insertable conductive structure includes the contact element and a stubby feature fixed to the contact element to form the unitary interconnection structure therewith.

6. The socket structure of claim 3, wherein the insertable conductive structure includes a conductive body defining a recess therein, the contact element inserted within the recess.

7. The socket structure of claim 1, wherein the contact element includes a coating thereon.

8. The socket structure of claim 1, wherein the contact element is a ground contact pin.

9. The socket structure of claim 8, wherein the cavity includes one or more cavity extensions extending in a direction toward one or more respective adjacent signal contact elements of the socket structure, the conductive structure at least in part within the one or more cavity extensions.

10. The socket structure of claim 9, wherein the one or more cavity extensions include individual extensions respectively extending in a direction of a respective one of the adjacent signal contact elements.

11. The socket structure of claim 1, wherein the conductive structure includes a portion that extends beyond the cavity of the socket structure housing and onto a top surface of the socket structure housing, the top surface to face a surface of the package when the contact element is electrically coupled to the package.

12. The socket structure of claim 11, wherein the socket structure housing includes an interstitial seating plane on a top surface thereof, and the portion of the conductive structure includes a conductive coating on the interstitial seating plane (ISP).

13. The socket structure of claim 1, further including a split region, and conductive tuning features on the split regions.

14. The socket structure of claim 13, wherein the socket structure housing defines tuning feature holes, and the conductive tuning features are inserted into the holes.

15. An microelectronic system comprising:
   a microelectronic package containing package circuitry, and package contacts configured to provide signals and ground to the package circuitry;
   a motherboard containing motherboard circuitry and motherboard contacts configured to provide signals and ground between the motherboard circuitry and the package circuitry; and
   a microelectronic socket structure between the package and the motherboard and including:
      a socket structure housing defining a plurality of cavities therein; and
      a plurality of interconnection structures, individual ones of the interconnection structures including:
         a contact element at least in part within a corresponding one of the cavities, and electrically coupled to a corresponding one of the package contacts and the motherboard contacts, the contact element further including one of a signal contact element or a ground contact element; and
         a conductive structure at least in part within a corresponding one of the cavities and electrically coupled to the contact element at opposite sides of the contact element, the conductive structure having an inner contour that is non-conformal with respect to an outer contour of the contact element, the inner contour of the conductive structure facing the outer contour of the contact element.

16. The microelectronic system of claim 15, wherein the conductive structure includes a conductive coating on interior walls of the corresponding one of the cavities, the conductive coating on at least a portion of the interior walls.

17. The microelectronic system of claim 15, wherein the conductive structure includes an insertable conductive structure inserted into the corresponding one of the cavities of the socket structure housing.

18. The microelectronic system of claim 17, wherein the insertable conductive structure includes one or more conductive stubs.

19. The microelectronic system of claim 17, wherein the interconnection structure is a unitary interconnection structure, and the insertable conductive structure includes the contact element and a stubby feature fixed to the contact element to form the unitary interconnection structure therewith.

20. A computing system including:
a memory; and
a processors coupled to the memory and including an microelectronic system that comprises:
   a microelectronic package containing package circuitry, and package contacts configured to provide signals and ground to the package circuitry;
   a motherboard containing motherboard circuitry and motherboard contacts configured to provide signals and ground between the motherboard circuitry and the package circuitry; and
   a microelectronic socket structure between the package and the motherboard and including:
     a socket structure housing defining a plurality of cavities therein; and
     a plurality of interconnection structures, individual ones of the interconnection structures including:
       a contact element at least in part within a corresponding one of the cavities, and electrically coupled to a corresponding one of the package contacts and the motherboard contacts, the contact element further including one of a signal contact element or a ground contact element; and
       a conductive structure at least in part within a corresponding one of the cavities and electrically coupled to the contact element at opposite sides of the contact element, the conductive structure having an inner contour that is non-conformal with respect to an outer contour of the contact element, the inner contour of the conductive structure facing the outer contour of the contact element.

21. The computing system of claim 20, wherein the conductive structure includes a conductive coating on interior walls of the corresponding one of the cavities, the conductive coating on at least a portion of the interior walls.

22. The computing system of claim 20, wherein the conductive structure includes an insertable conductive structure inserted into the corresponding one of the cavities of the socket structure housing.

23. A method of fabricating a socket structure for a microelectronic system, the method including:
providing a cavity in a socket housing made of a dielectric material;
providing an interconnection structure including:
   a contact element at least in part within the cavity, and to be electrically coupled to a corresponding microelectronic package, the contact element corresponding to one of a signal contact element or a ground contact element; and
   a conductive structure at least in part within the cavity and electrically coupled to the contact element at opposite sides of the contact element, the conductive structure having an inner contour that is non-conformal with respect to an outer contour of the contact element, the inner contour of the conductive structure facing the outer contour of the contact element.

24. The method of claim 23, wherein providing the interconnection structure includes providing the conductive structure by coating on interior walls of the cavity with a conductive coating.

25. The method of claim 23, wherein providing the interconnection structure includes forming an insertable conductive structure as the conductive structure, and inserting the insertable conductive structure into the cavity of the socket structure housing.

\* \* \* \* \*